United States Patent [19]

Isozaki et al.

[11] Patent Number: 5,243,293
[45] Date of Patent: Sep. 7, 1993

[54] SYSTEM UTILIZING OPTICAL CURRENT SENSORS FOR DETECTING FAULT LOCATION IN SUBSTATION

[75] Inventors: Takashi Isozaki, Komaki; Katsuro Shinoda, Nagoya; Toshiyuki Kawaguchi, Inuyama; Hiroyuki Katsukawa, Aichi; Kazumi Nakanishi, Inuyama; Hiroyuki Abe, Anjyo; Yasuhisa Sakurai, Komaki, all of Japan

[73] Assignee: NGK Insulators, Ltd., Aichi, Japan

[21] Appl. No.: 357,533

[22] Filed: May 26, 1989

[51] Int. Cl.$^5$ .................... G01R 31/08; H04B 3/46
[52] U.S. Cl. ................................ 324/522; 324/96; 324/244.1
[58] Field of Search ............... 324/96, 244, 501, 509, 324/510, 512, 522, 524, 529, 530, 537, 538, 547, 244.1; 361/333, 341, 63, 93

[56] References Cited

U.S. PATENT DOCUMENTS 3,710,247 1/1973 Kessler et al. .................. 324/96
4,894,609 1/1990 Fujiki et al. .................. 324/96 X

FOREIGN PATENT DOCUMENTS 0165803 12/1985 European Pat. Off. ............ 324/501
2430112 1/1980 France .
59-34169A 6/1984 Japan .
59-38663A 6/1984 Japan .
2198001 6/1988 United Kingdom .

Primary Examiner—Kenneth A. Wieder
Attorney, Agent, or Firm—Parkhurst, Wendel & Rossi

[57] ABSTRACT

A system for detecting a fault occurred within a substation and judging a location of the fault including optical current sensors each having a Faraday element arranged on a top of an insulator post of a bus disconnecting switch, a magnetic core arranged to surround a terminal plate of the disconnecting switch to generate a magnetic field corresponding to a current passing through the terminal plate, a laser diode for emitting a laser light beam, an optical fiber for guiding the laser beam to the Faraday element, a photodiode, and an optical fiber for guiding the laser beam transmitted through the Faraday element to the photodiode. The photodiode supplies a signal representing the current passing through the terminal plate to a fault location judging circuit in which the fault location within the substation is judged from the signals from the photodiodes.

14 Claims, 24 Drawing Sheets

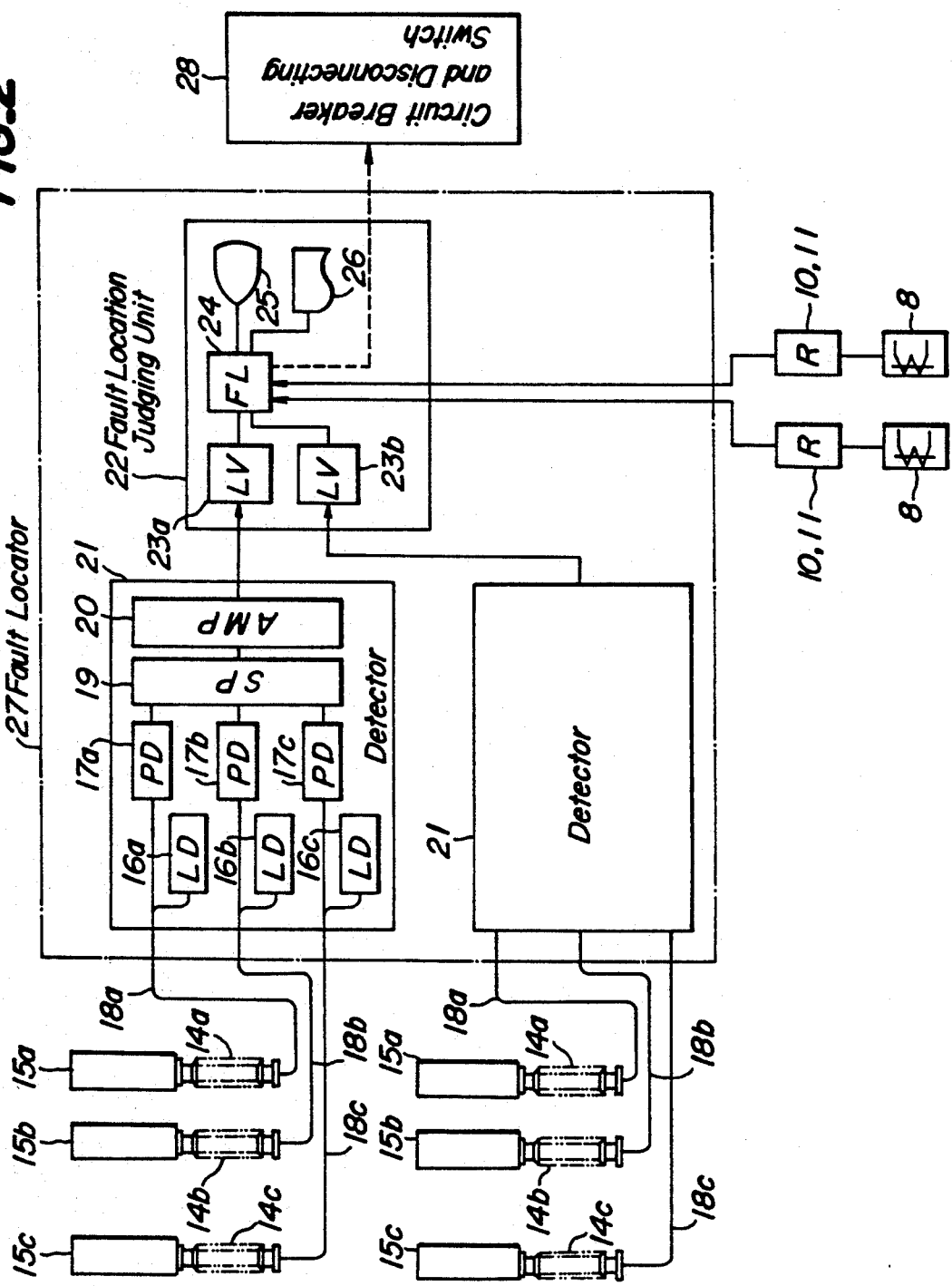

FIG._4
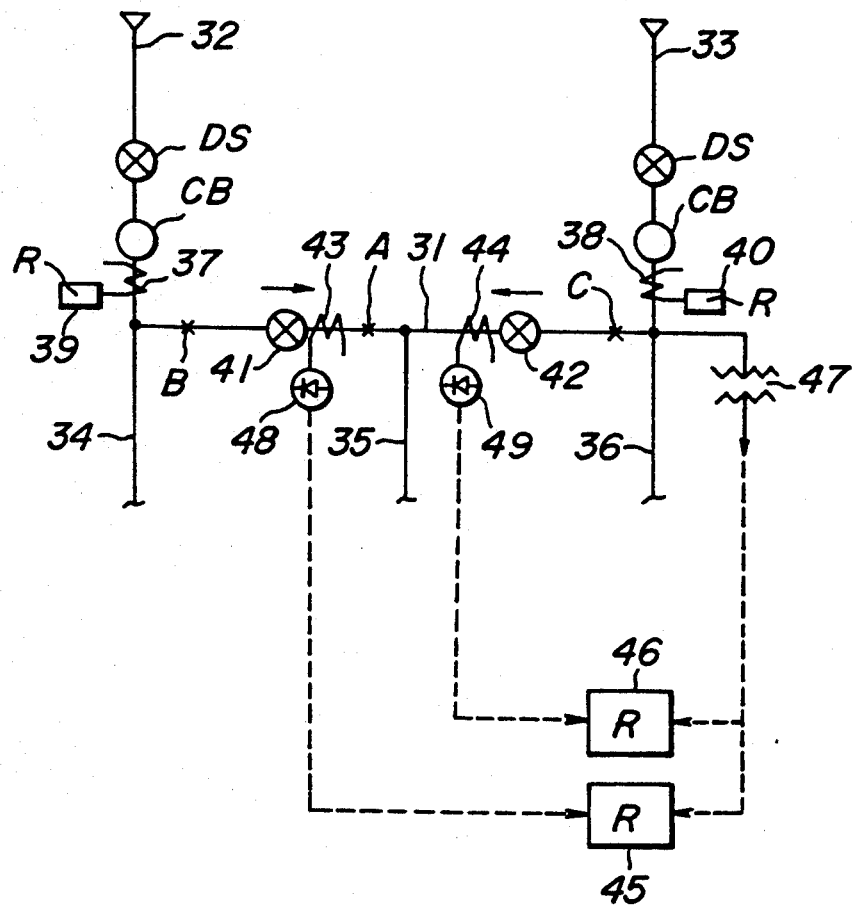

FIG_18

SYSTEM UTILIZING OPTICAL CURRENT SENSORS FOR DETECTING FAULT LOCATION IN SUBSTATION

BACKGROUND OF THE INVENTION

1. Field of the Invention

The present invention relates to a system for detecting a location of a fault which might occur in a substation, and more particularly to a system for detecting a ground fault and a short-circuit fault which might occur in a bus section within a distribution substation and a transmission substation.

2. Related Art Statement

In the transmission substation, one or more input lines are connected to one or more bus bars and the bus bars are connected to a plurality of output lines or banks by means of transformers. In the input lines there are connected current transformers for detecting currents passing through the input lines and circuit breakers for interrupting the power supply, and in the bus bars there are connected disconnecting switches for disconnecting the bus bars. In order to detect the ground fault or short-circuit fault, each current transformer is connected to a ground fault detection relay and/or short-circuit fault detection relay. When a relay connected to a current transformer in a certain input line detects a fault, a circuit breaker connected in the relevant input line is opened and one or more disconnecting switches are operated to disconnect the output lines from the input line in which the fault has occurred. In an unattended substation, the output signals of the relays are supplied to a remote control station in which an operator can detect the fault at the substation in accordance with the output signals sent from the unattended substation. It should be noted that from the signals supplied from the substation, the operator can know whether the fault has occurred outside the substation or inside the substation. However, in the known supervisory system, the operator could not know a precise location of the fault within the substation. Therefore, in the unattended substation, the operator has to find an actual location of the fault by visually observing various equipments within the substation. In this case, until the operator finds the fault location, all the transformers in the substation have to be remained inoperative and thus the electric power supply is totally interrupted for a relatively long time over a very wide range. The same problem occurs not only in the transmission substation, but also in the distribution substation.

SUMMARY OF THE INVENTION

The present invention has for its object to provide a novel and useful system for detecting a location of a fault in a substation, by means of which a precise location of fault within the substation can be detected easily and accurately.

It is another object of the invention to provide a fault location detecting system in which equipment, in a substation is not complicated in construction and large in size.

It is still another object of the invention to provided a fault location detecting system by means of which a fault location within a substation can be automatically detected.

According to the invention, a system for detecting a location of a fault within a substation in which at least one input line is connected to a plurality of output lines by means of at least one bus bar and a plurality of bus disconnecting switches are connected in circuit portions connecting the input lines and output lines with each other, comprises a plurality of optical current sensors each being arranged to detect currents passing through respective circuit portions for producing a current detection signal which represents the current flowing through respective circuit portions; and a fault location detecting means connected to said optical current sensors to receive the current detection signals and process them to derive a signal by means of which a location of a fault within the substation can be judged.

In a preferred embodiment of the system according to the invention, the optical current sensor includes a magneto-optical element such as a Faraday element arranged in a magnetic field generated by a current passing through a bus bar, and optical fibers for transmitting a laser beam emitted from a laser light source to the magneto-optical element and a laser beam transmitted and modulated by the magneto optical element to a light receiving element. The optical fibers are passed through a central through-hole formed in a station post insulator of a disconnecting switch for the bus bar. In this embodiment, since the existing insulator post of the disconnecting switch is utilized to arrange the optical current sensor, the equipment in the substation does not become complicated in construction and large in size. Further, the optical fibers are accommodated in the insulator post, so that the optical fibers can be effectively protected against various kinds of interferences for a long time.

In another preferred embodiment of the fault location detecting system according to the invention, said locator comprises a display unit for displaying visually the detected fault location within the substation. As will be explained in detail hereinafter, the fault location can be determined in various modes. In an overcurrent detection mode, the fault location is judged from the information from the optical current sensors and that of operation and non-operation of relays. In a direction comparison mode, the fault location is judged from the phase of the current detected by the optical current sensor and that of the voltage detected by a transformer. In a phase comparison mode, the fault location is judged from a comparison of the phase angle of the fault currents at two different points.

BRIEF DESCRIPTION OF THE DRAWINGS

FIG. 2 is a block diagram of the system shown in FIG. 1;

FIG. 4 is a circuit diagram for explaining the operation of the fault location detection;

DESCRIPTION OF THE PREFERRED EMBODIMENTS

Now the present invention will be explained in detail with reference to embodiments shown in the accompanying drawings.

Figure 1:
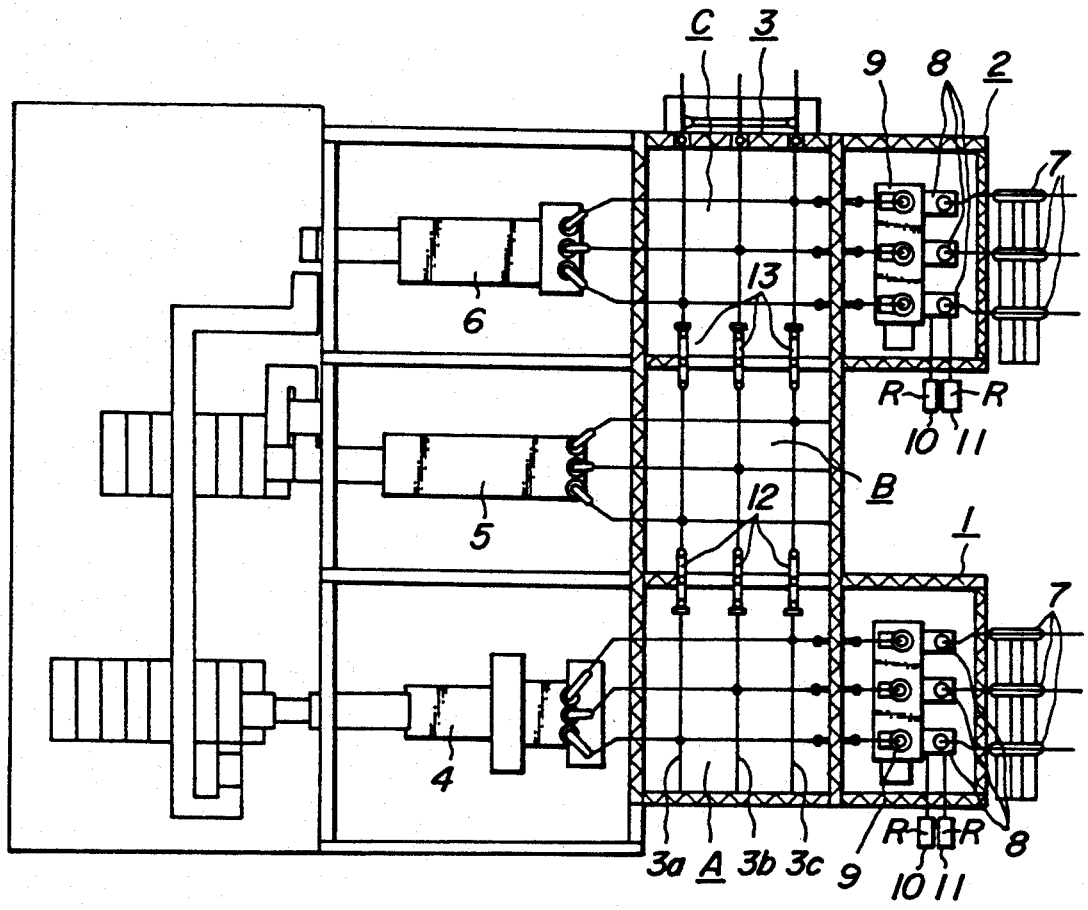
FIG. 1 is a schematic plan view showing the construction of the substation to which an embodiment of the fault location detecting system according to the present invention is applied.

FIG. 1 is a schematic plan view illustrating the construction of a typical unattended transmission substation to which the fault location detecting system according to the invention is applied. In FIG. 1, reference numerals 1 and 2 denote first and second power reception sections, 3 a bus section, and 4, 5 and 6 represent transformers. In the bus section 3, there are provided three bus bars 3a, 3b and 3c each corresponding to respective phase conductors of a three-phase alternating current power supply, and the three transformers 4, 5 and 6 are parallelly connected to the bus bars as shown in FIG. 1. In operation, the electric power supply is effected by means of one of the two power reception sections 1 and 2. The electric power transmitted through input lines connected to, for instance, the power reception section 1 is supplied via the three bus bars 3a, 3b and 3c to the transformers 4, 5 and 6, and output power from these transformers is further supplied to load lines, i.e. banks. In the input lines there are connected disconnecting switches 7, and in the power reception sections 1 and 2, current transformers 8 and circuit breakers 9 are connected in series with respective conductors of three phase input lines. Further, the current transformers 8 are connected to ground-fault detecting relays (R) 10 and short-circuit fault detecting relays (R) 11 so that the occurrence of the ground-fault and short-circuit fault within the unattended substation can be automatically detected. In response to the detected signals from the relays 10, 11, the circuit breakers 9 are operated to interrupt the power supply. These detected signals are also supplied to a remote control station, and an operator in the control station can know the accident within the substation. In the bus section 3, in each bus bars 3a, 3b and 3c there are connected bus bar disconnecting switches 12 and 13. That is to say, the bus section 3 is divided into three subsections A, B and C. In the present embodiment, the bus bar disconnecting switches 12 and 13 are constructed to include optical current sensors.

As shown in FIG. 2, each of the optical current sensors comprises three sensor heads 15a, 15b and 15c provided on tops of insulator posts 14a, 14b and 14c of the bus bar disconnecting switches 12 and 13. In each of the sensor heads 15a, 15b and 15c, there are arranged Faraday elements. The optical current sensors further comprise light emitting elements 16a, 16b and 16c such as laser diodes (LD) for emitting laser light beams, light receiving elements 17a, 17b and 17c such as photodiodes (PD), and three pairs of optical fibers 18a, 18b and 18c for transmitting the laser light beams emitted from the light emitting elements (LD) to the sensor heads 15a, 15b and 15c and guiding the laser beams transmitted through the sensor heads to the light receiving elements (PD). In the sensor heads 15a, 15b, 15c, the laser light beam transmitted through the optical fiber is made incident upon the Faraday element via a polarizer. Then, the polarization plane of the laser light beam is changed or rotated in accordance with the strength of the magnetic field applied to the Faraday element. The laser light beam transmitted through the Faraday element is then made incident upon the optical fiber by means of an analyzer. Therefore, an amount of the laser light transmitted through the analyzer is changed in accordance with the strength of the magnetic field. Therefore, output signals derived from the photodiodes 18a, 18b and 18c represent the magnitude of currents passing through the bus bars near which the Faraday elements are arranged, and are supplied to a signal processor (SP) 19. Then an output from the signal processor is then supplied to an output amplifier (AMP) 20. The laser diodes 16a, 16b, 16c; photodiodes 17a, 17b, 17c; signal processor 19 and output amplifier 20 constitute a detector 21 for detecting the magnitude of the currents passing through the bus bars. Output signals from the detector 21 are supplied to a fault location judging unit 22 which includes level detectors (LV) 23a and 23b, a fault location judging circuit (FL) 24, a display 25 and a printer 26. The detectors 21 and fault location judging unit 22 are provided in a fault locator 27 which is arranged at a suitable position in the substation. To the fault location judging circuit (FL) 24 are also connected the ground-fault detecting relays 10 and short-circuit fault detecting relays 11. Each of the level detectors 23a and 23b operates such that the signal supplied from the output amplifier 20 is compared with a predetermined threshold value and if the input signal is smaller than the threshold value, the level detector generates a logic 0 signal, but when the input signal exceeds the threshold value, it produces the output signal of the logic 1. It should be noted that the threshold value may be determined experimentally. For instance, when the substation has such specifications that the rated voltage is 72 KV and rated current is 3000 A, the short-circuit current amounts to 1 to 31.5 KA for each phase and the ground current amounts to 30 to 300 A for the zero phase. Then, the threshold value may be set to 1200 A for the short-circuit fault and 60 A for the ground fault. In the fault location judging unit 22, the fault location within the substation is judged by processing the above mentioned logic signals supplied from the level detectors 23a, 23b and relays 10, 11 in a matrix method which will be explained in detail hereinafter.

Now the operation of detecting a location of a fault within the substation in accordance with the matrix method will be explained by taking an example in which an internal fault occurs in the bus section 3 during the receipt of the power supply by means of the first power reception section 1. In this case, if the fault occurs in the subsection A of the bus section 3, the current transformers 8 in the first power reception section 1 are operated, but the optical current sensors provided in the bus disconnecting switches for disconnecting the subsections A and B from each other are not operated. Then, it is possible to judge that the fault has occurred in the subsection A. In this case, the disconnecting switches 12 are opened to separate the abnormal subsection A in which the fault has occurred from the remaining normal subsections B and C, and the power supply through the normally operating subsections B and C can be started again promptly by closing the disconnecting switches 7 and circuit breakers 9 in the second power reception section 2. If the fault occurs in the subsection B, the current transformers 8 in the first power reception section 1 as well as the optical current sensors arranged in the disconnecting switches 12 between the subsections A and B are operated, but the optical current sensors in the disconnecting switches 13 between the subsections B and C are not operated. Then, it can be judged that the fault has occurred in the second subsection B. In this case, the disconnecting switches 12 and 13 are all opened so that the abnormal subsection B is separated from the normal subsections A and C, and the power supply by means of the normal subsections can be initiated by connecting the disconnecting switches 7 and the circuit breakers 9 in both the power reception sections 1 and 2. In case that the fault occurs in the subsection C, the current transformers 8 in the power reception section 1 and the optical current sensors in the disconnecting switches 12 and 13 are all operated. Then, the abnormal subsection C can be separated from the normal subsections A and B by opening the disconnecting switches 13 between the subsections B and C, and the power supply through the normal subsections A and B can be recovered by closing the disconnecting switches 7 and circuit breakers 9 in the first power reception section 1.

In the above mentioned explanation, the power supply is received by the first power reception section 1, and when the power supply is effected by the second power reception section 2, the fault location can be equally judged by the matrix method. Further, when the fault has occurred in any subsection A, B or C, the ground fault detecting relays 10 and short-circuit fault detecting relays 11 connected to the current transformers 8 are always operated so that the normal protecting operation is carried out positively.

It should be noted that even if the output signals from the current transformers 8 could not be utilized by any reason, it is still possible to judge whether the fault has occurred within the portion between the optical current sensors provided in the disconnecting switches 12 and those arranged in the disconnecting switches 13 or outside this portion by comparing the phase of the output signals from these optical current sensors as will be explained hereinbelow with reference to FIG. 3.

Figure 3A:
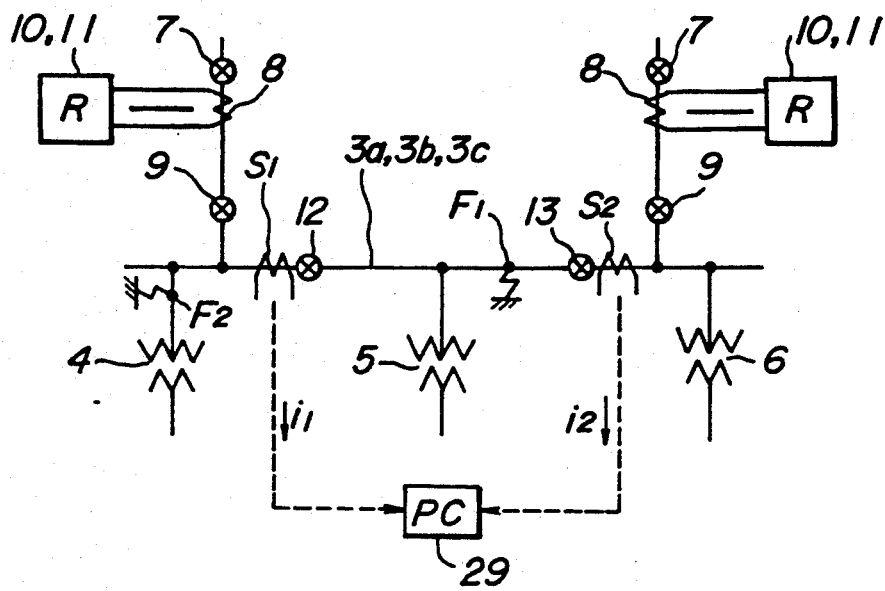
FIG. 3A is a circuit diagram illustrating the principal construction of the system of FIG. 1 and FIGS. 3B to 3E are signal waveforms for explaining the operation of the system.
Figure 3B:
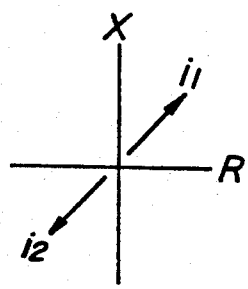
Figure 3C:
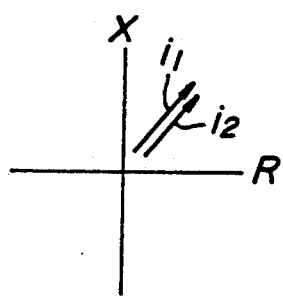
Figure 3D:
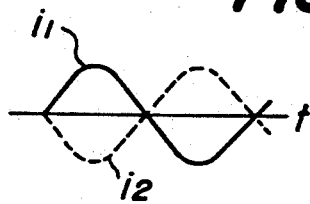
Figure 3E:
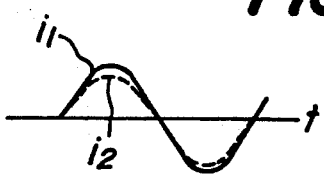

FIG. 3A is a circuit diagram of a portion of the bus section 3, FIGS. 3B and 3C are diagrams of the phase of output signals of the optical current sensors $S_1$ and $S_2$, and FIGS. 3D and 3E are waveforms of the output signals from the optical sensors $S_1$ and $S_2$ in case of the fault. It should be noted that the optical current sensors $S_1$ and $S_2$ are constructed such that the directions of the currents can be also detected. If the ground fault occurs at a point $F_1$ within the portion between the optical current sensors $S_1$ and $S_2$, then the directions of the currents $i_1$ and $i_2$ flowing through the optical sensors become opposite to each other as illustrated in FIGS. 3B and 3D. However, if the ground fault occurs at a point $F_2$ outside the optical current sensors $S_1$ and $S_2$, the directions of the currents $i_1$ and $i_2$ become identical with each other as shown in FIGS. 3C and 3E. Therefore, by comparing the phase of the currents $i_1$ and $i_2$ detected by the optical current sensors $S_1$ and $S_2$ with the aid of a phase comparator (PC) 29, it is possible to determine whether the fault location is within the optical current sensors $S_1$ and $S_2$ or outside the optical current sensors.

In the manner explained above, the fault location judging unit 24 can determine the fault location and the detected fault location is displayed on the display unit 25 which may be constructed by the liquid crystal display device and may be recorded on a record paper in the printer 26. It should be noted that when the fault is detected, the fault location judging unit 24 may supply control signals to a switching unit 28 including the circuit breakers 9 and disconnecting switches 7, 12, and 13 so that this switching equipment can be operated automatically. This operation can be effected in the well known manner and thus, its explanation is dispensed with.

FIG. 4 is a circuit diagram showing the principal construction of an embodiment of the fault location detecting system according to the invention. In the present embodiment, the fault location detecting system is applied to the distribution substation, and the fault location is judged by detecting the direction of the currents. In this current direction method, the phases of the current and voltage are compared with each other, and when the current and voltage have the same phase, it is judged that the fault has occurred within the portion between the optical current sensors. A reference numeral 31 denotes a single bus bar and 32 and 33 represent input lines, i.e. banks connected to the bus. It should be noted that these input lines are depicted as a single line in the drawing, but in practice each of the lines contains three conductors corresponding to three phases. To the bus bar 31 there are connected output lines 34, 35 and 36. In the input lines 32 and 33 there are connected current transformers 37 and 38 to detect currents passing through the input lines, and ground-fault and short-circuit fault detecting relays 39, 40 are connected to the current transformers. The construction so far explained has been known and circuit breakers CB and disconnecting switches DS connected in the input lines 32 and 33 are operated in accordance with the operational conditions of the relays. In the bus bar 31 there are connected bus bar disconnecting switches 41 and 42 and optical current sensors 43 and 44. The optical current sensors 43 and 44 are connected to relays (R) 45 and 46 which may be the known ground current direction detecting relay and short-circuit current direction detecting relay. The other inputs of the relays 45 and 46 are coupled with the bus bar 31 by means of a transformer 47 to detect the voltage applied on the bus bar 31. As will be explained later, the optical current sensors 43 and 44 include photodiodes 48 and 49 which are connected to the relays 45 and 46.

It is assumed that the power supply is effected by means of both the input lines 32 and 33. When the ground fault occurs at a point A in FIG. 4, large fault currents flow from the input lines 32 and 33 to the point A as shown by arrows, and the directions of these currents are detected by the relays 45 and 46. Then, it is possible to judge that the ground fault has occurred at a point within the portion between the optical current sensors 43 and 44. When the ground fault occurs at a point B situated on the left hand side of the optical current sensor 43, the currents flow toward the left hand side in the optical current sensors 43 and 44, and when the ground fault occurs at a point C situated on the right hand side of the optical current sensor 44, the currents flow toward the right hand side in the optical current sensors 43 and 44. In this manner, in the present embodiment, by detecting the directions of the currents passing through the optical current sensors 43 and 44 and processing the detected directions of the currents by means of a logic circuit, it is possible to determine the location of the fault within the bus bar 31. Upon the fault, the disconnecting switches 41 and 42 are selectively operated to disconnect a circuit portion including the fault and the power supply can be restored soon for a remaining normal section. It should be noted that the relays 46 and 47 supply the output signals having the logic levels. That is to say, when the detected current and voltage have the same phase, they generate the output signals having the logic level 0, and when the current and voltage have different phases, they supply the output signals having the logic level of 1.

Figure 5:
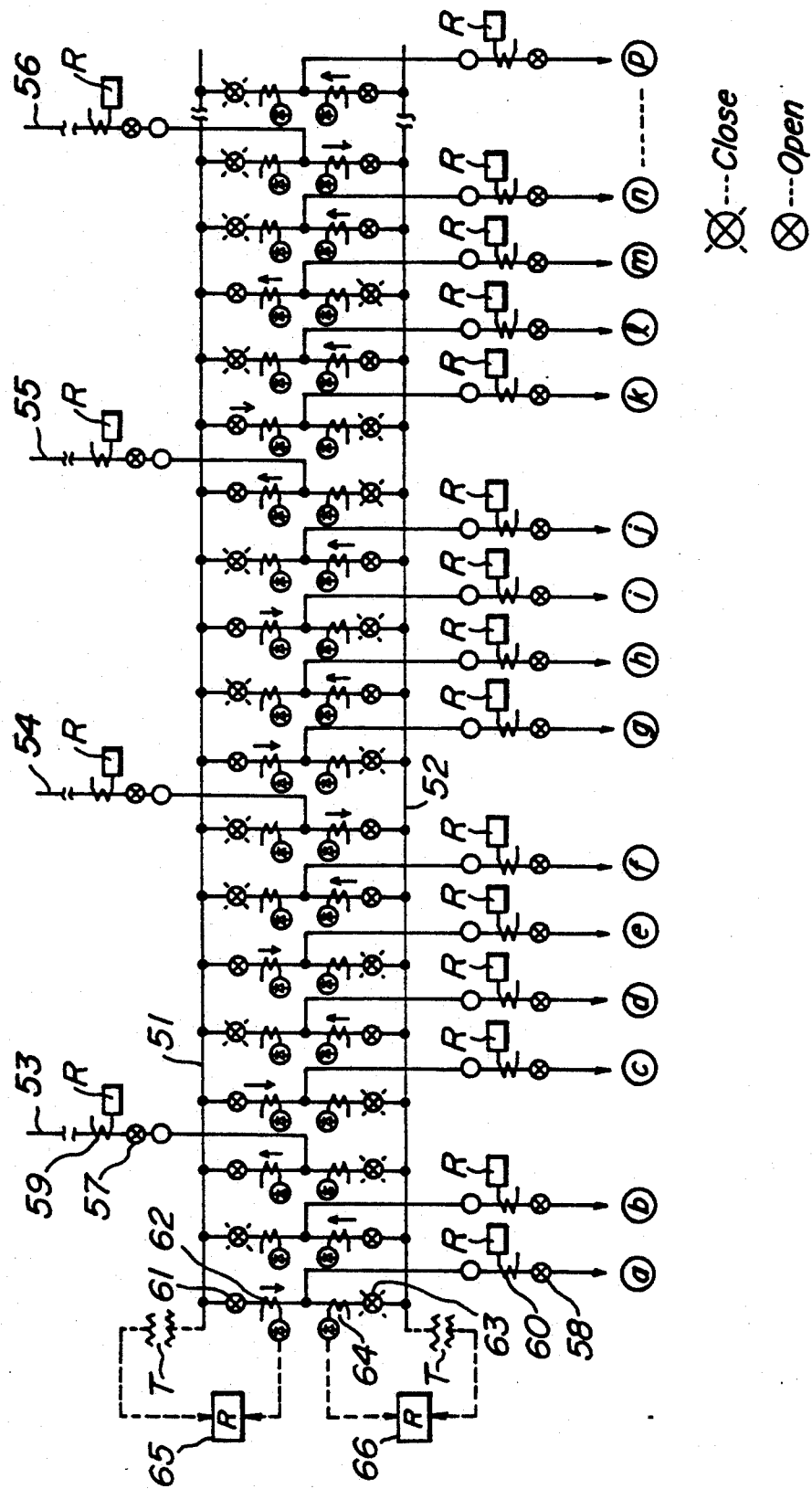
FIG. 5 is a circuit diagram representing an embodiment of the fault location detecting system according to the invention applied to the transmission substation.

FIG. 5 is a circuit diagram showing another embodiment of the fault location detecting system according to the invention which is applied to the transmission substation having a double bus system. In FIG. 5 reference numerals 51 and 52 denote bus bars, 53, 54, 55 and 56 represent first to fourth input lines, i.e. banks, and a to p depict load lines. In the banks 53 to 56 and load lines a to p there are connected disconnecting switches 57, 58 and current transformers 59, 60, respectively. The banks 53 to 56 may be connected to the bus bar 51 by means of disconnecting switches 61 and optical current sensors 62 as well as to the bus bar 52 via disconnecting switches 63 and optical current sensors 64. Further, the load lines a to p are connected to junction points between the series circuits of the disconnecting switches 61, 63 and optical current sensors 62, 64. In the condition shown in FIG. 5, odd numbered banks 53 and 55 are connected to the bus bar 51 by means of the closed disconnecting switches 62 and odd numbered load lines a, c, e . . . are connected to the bus bar 51 by means of the closed disconnecting switches 58, and even numbered banks 54 and 56 are connected to the bus bar 52 by means of the closed disconnecting switches 58 and 61, and the even numbered load lines b, d, f, . . . are connected to the bus bar 52 via the closed disconnecting switches 58 and 63 as shown by arrows in FIG. 5. In the drawings, closed disconnecting switches are represented by (X) and opened disconnecting switches are denoted by ⊗. The optical current sensors 62 and 64 are connected (R) 65 and 66 which are also coupled with the bus bars 51 and 52 via transformers (T) and can detect the direction of the current passing therethrough by comparing the phases of the current and voltage. In the drawing of FIG. 5, only the left hand relays 65 and 66 are shown, but it should be noted that the remaining optical current sensors are also connected to their own relays.

Figure 6:
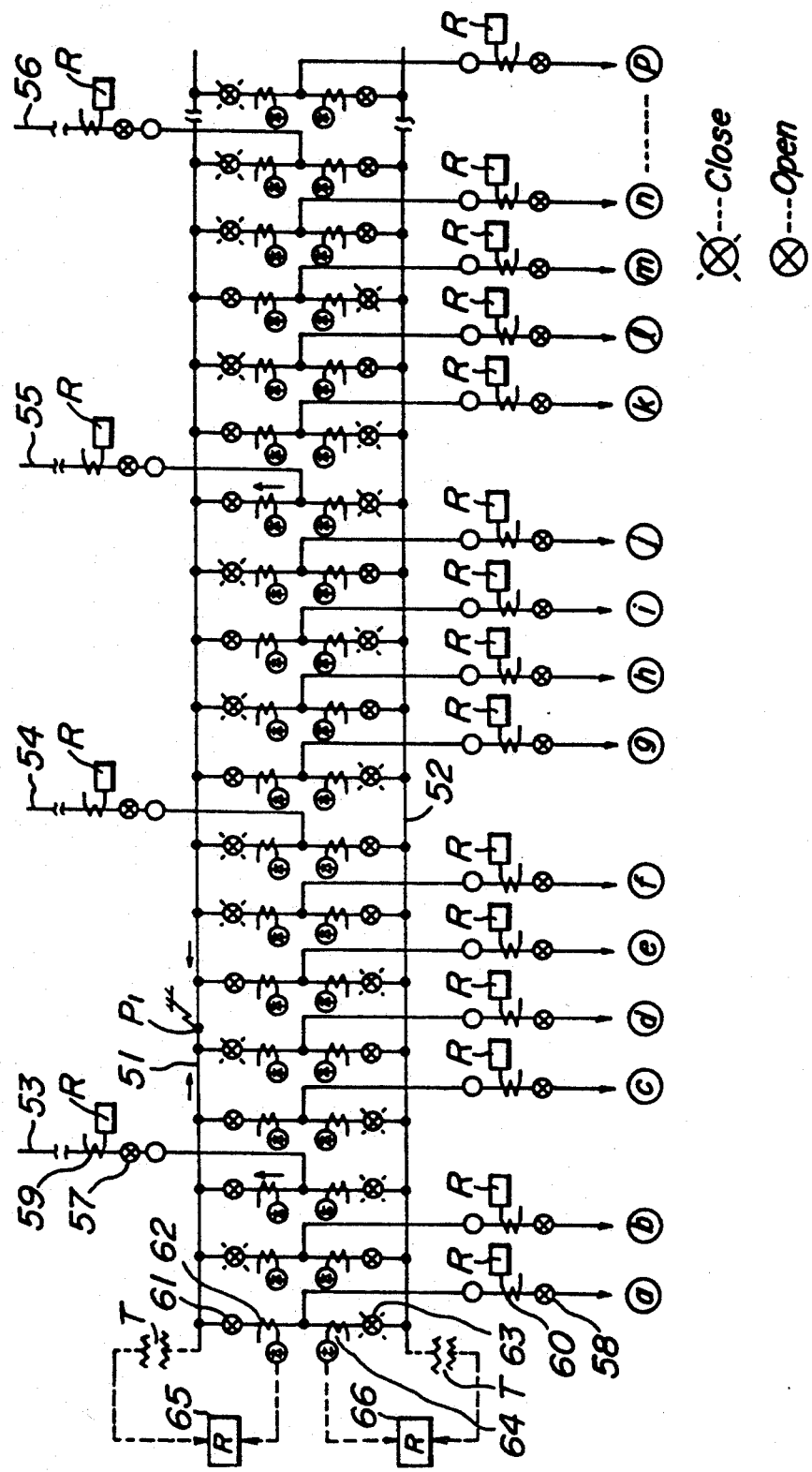
FIGS. 6 to 11 are circuit diagrams for explaining the operation of the system shown in FIG. 5 under the fault occurring at various points within the substation.
Figure 7:
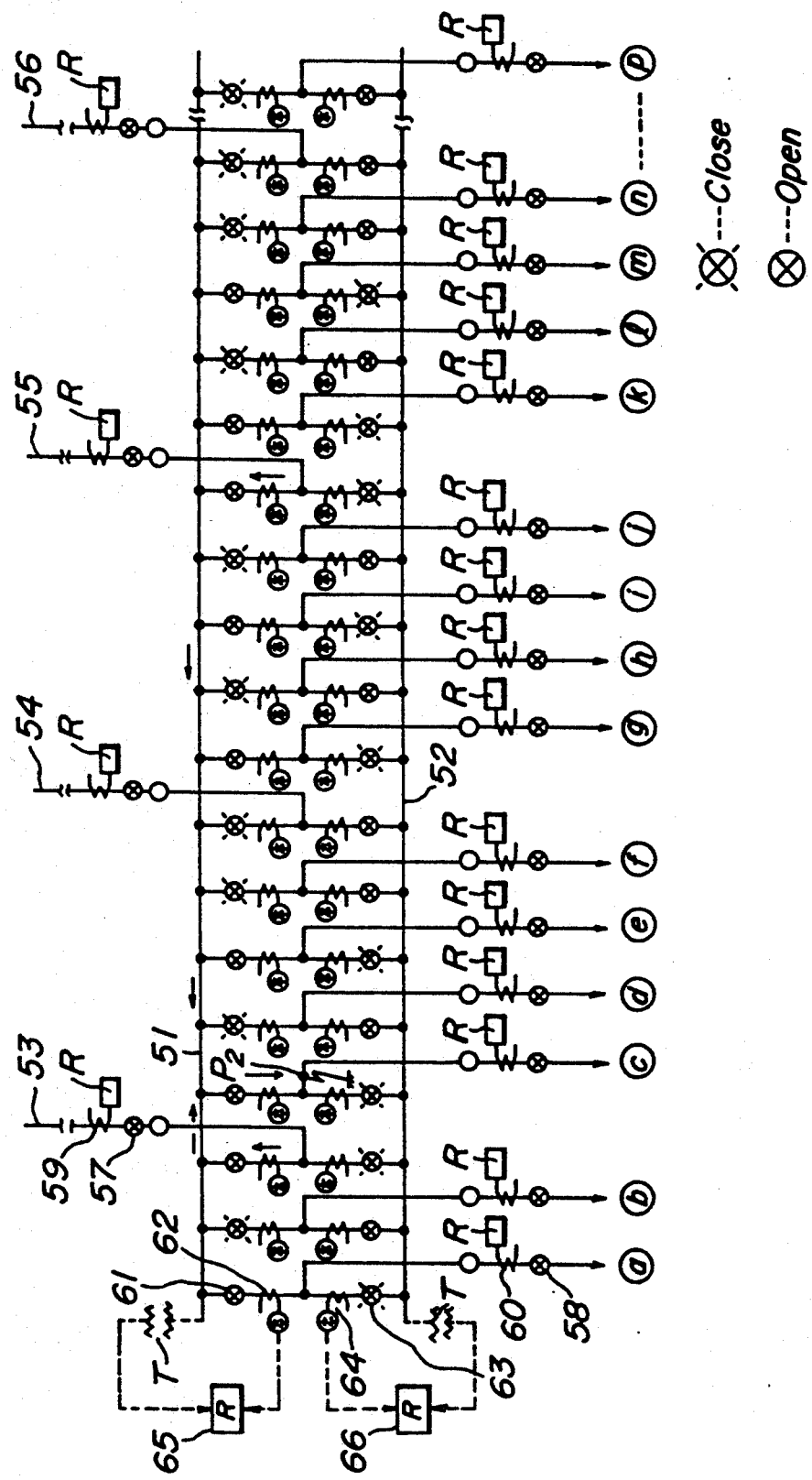
Figure 8:
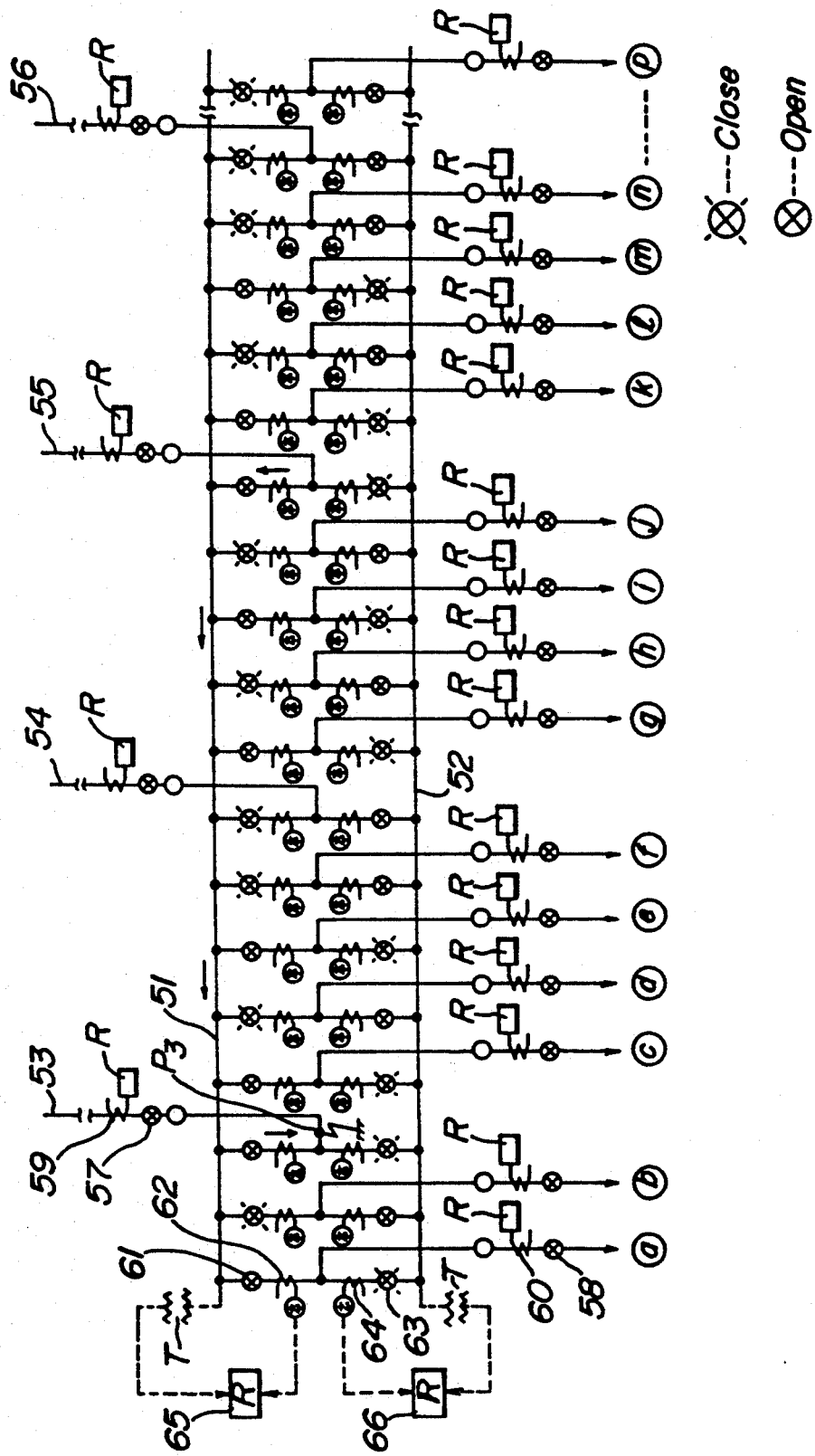
Figure 9:
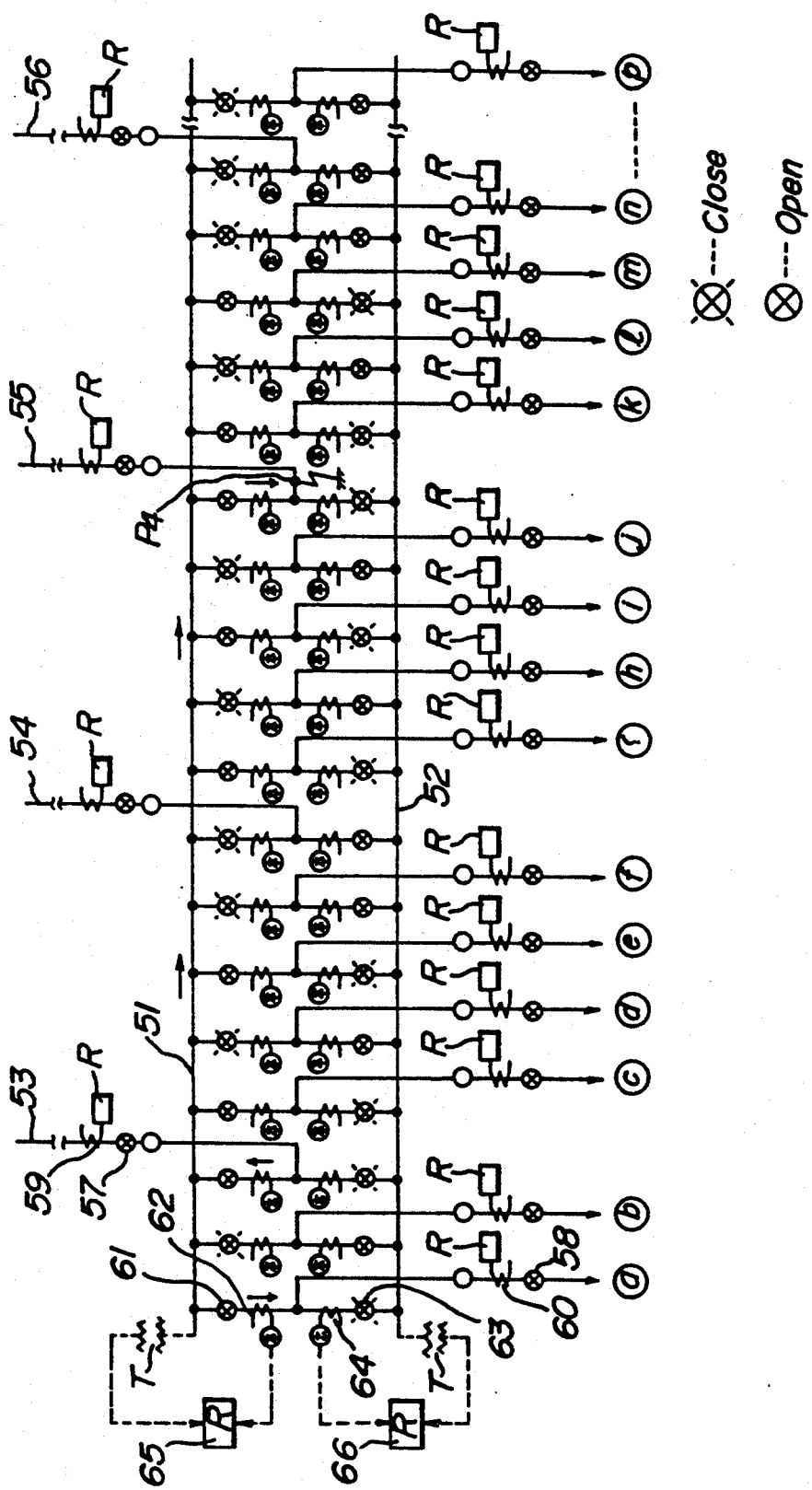
Figure 10:
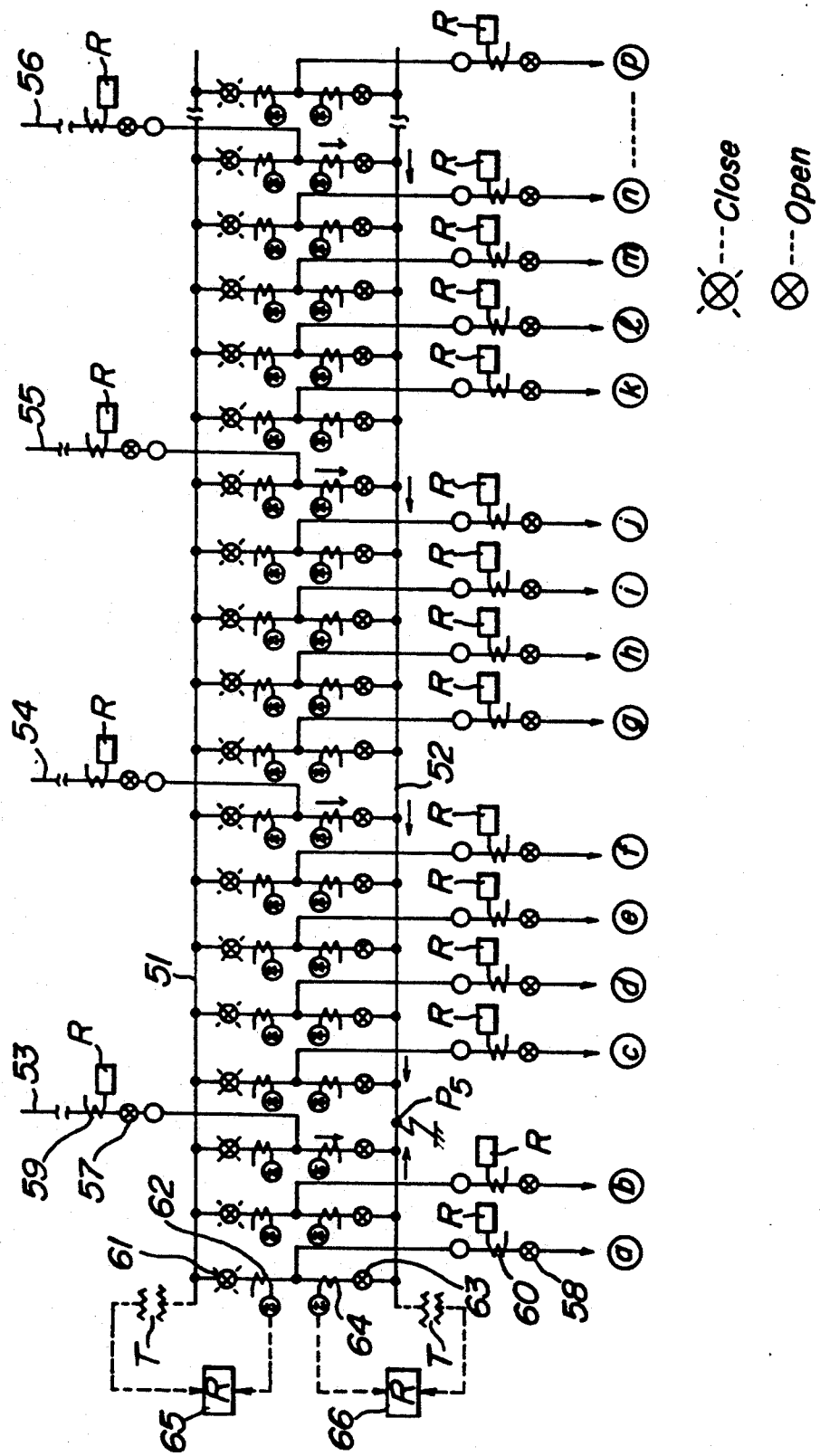
Figure 11:
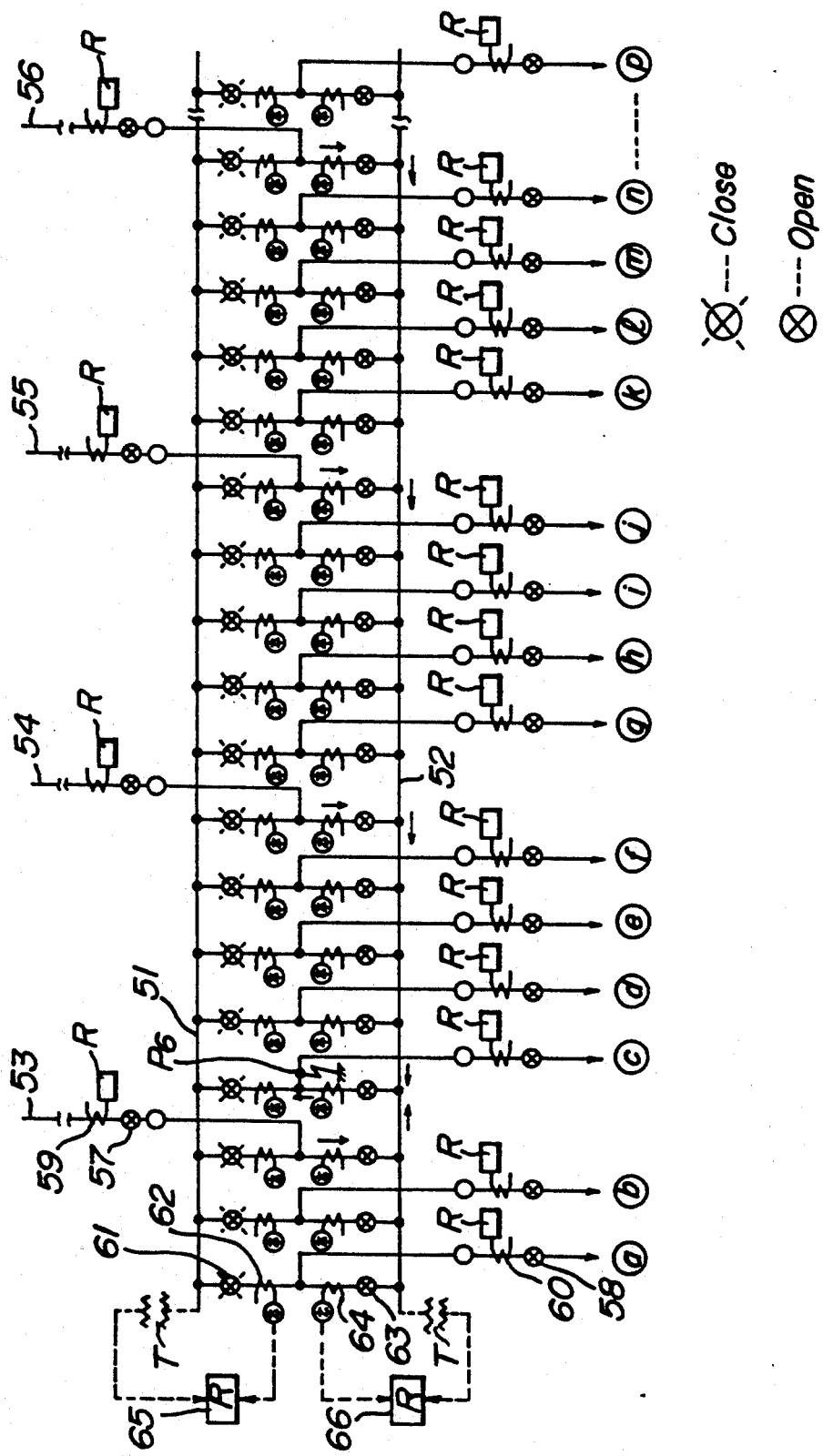

In the distribution substation shown in FIG. 5, in the normal condition the currents flow in the directions represented by the arrows and the electric power is supplied to the load lines a to p. FIGS. 6 to 11 illustrate conditions under faults occurring at various points within the bus bars. As shown in FIG. 6, when the fault occurs at a point $P_1$ on the bank 51, the optical current sensors 62 and relays 65 connected to the odd numbered banks 53 and 55 detect the large currents flowing upwards. When the fault occurs at a point $P_2$ near the junction point connected to the third load line c as shown in FIG. 7, the optical current sensors 62 and relays 65 connected to the odd numbered banks 53 and 55 detect the upward large current and at the same time, the optical current sensor 62 and relay 65 connected to the third load line c in which the fault has occurred detect a downward large current. When the fault occurs at a point $P_3$ near the junction point between the first bank 53 and series circuit of the optical current sensors 62 and 64 as illustrated in FIG. 8, the optical current sensor 62 connected to the relevant first bank 53 detects the downward large current and at the same time the optical current sensor 62 connected to the third bank 55 detects the upward large current. FIG. 9 illustrates the case in which the fault occurs at a point $P_4$ on the third bank 55, FIG. 10 represents the case in which the fault occurs at a point $P_5$ on bus bar 52 when the other bus bar 51 is not operated, and FIG. 11 denotes the case in which the fault occurs at a point $P_6$ on the load line c while the bus bar 51 is not operated. The following Table represents the directions of the currents under the fault at various points.

TABLE

| | | Direction of Current | | | | | |
|---|---|---|---|---|---|---|---|
| Bus | Fault Location | 53 | 54 | 55 | 56 | Junction | FIG. |
| Normal | First bus | ↑ | | ↑ | | | 6 |
| | Junction of output line | ↑ | | ↑ | | ↓ | 7 |
| | Junction at input line 53 | ↓ | | ↑ | | | 8 |
| | Junction at input line 55 | ↑ | | ↓ | | | 9 |
| First bus inoperative | Second bus | ↓ | ↓ | ↓ | ↓ | | 10 |
| | Junction of output line | ↓ | ↓ | ↓ | ↓ | ↑ | 11 |

In the manner explained above, according to the present embodiment, it is possible to know the fault location by detecting the directions of the currents flowing through the optical current sensors arranged in the bus section of the substation. In this case, the output signals of the optical current sensors are supplied to the processing circuit such as a microcomputer via the relays and the fault location may be determined automatically. Further, it is also possible to delete the relays and the output of the optical current sensors may be directly supplied to the processing circuit. In this manner, the location of fault within the substation having the double bus bars can be positively detected in a prompt manner and the abnormal section can be separated from the normal section for which the power supply can be effected continuously.

Now the concrete construction of the various elements in the fault location detecting system according to the present invention will be explained in detail.

Figure 12:
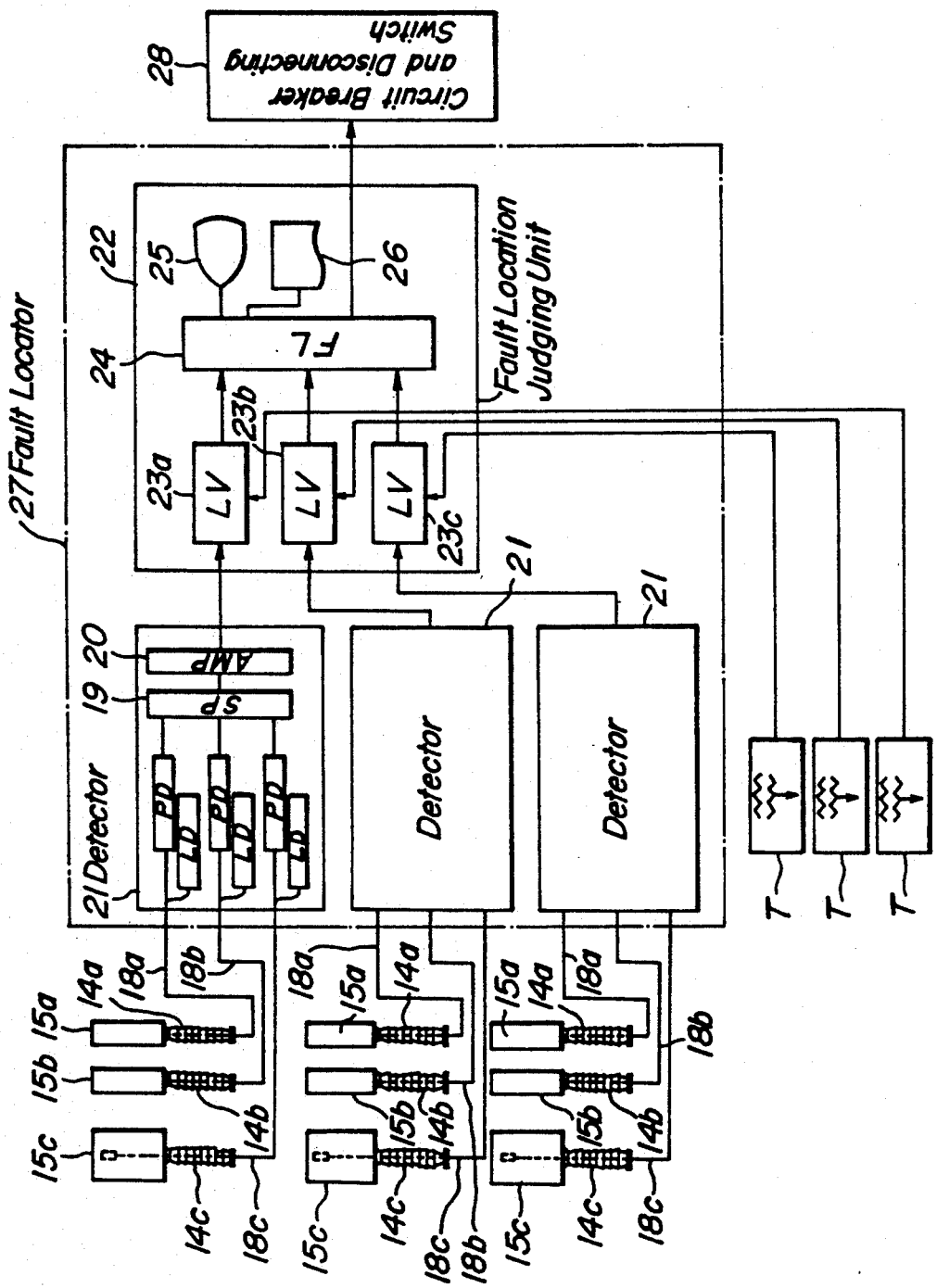
FIG. 12 is a block diagram of another embodiment of the fault location detecting system according to the invention.

FIG. 12 is a schematic view showing the construction of the fault location detecting system according to the invention, in which portions similar to those shown in FIG. 2 are denoted by the same reference numerals used in FIG. 2. The sensor heads 15a, 15b and 15c are arranged on the tops of the insulator posts 14a, 14b and 14c, respectively, of the bus bar disconnecting switches, and are coupled with the laser diodes 16a, 16b and 16c and photodiodes 17a, 17b and 17c in the detector 21 by means of the optical fiber pairs 18a, 18b and 18c which are passed through central holes formed in the insulator posts. The output signals of the photodiodes 17a, 17b and 17c are supplied via the signal processor 19 and output amplifier 20 to the level and direction detectors 23a, 23b and 23c provided in the fault location judging unit 22. Then, the output signals from the level and direction detectors are supplied to the fault location detecting circuit 24 to determine the location of the fault which is then displayed on the display unit 25 and is recorded on the recording sheet in the printer 26. The fault location detecting circuit 24 supplies the control signals to the switching unit 28 including the circuit breakers and disconnecting switches. To the level and direction detectors 23a, 23b and 23c are also supplied the output signals from the transformers T. In the fault location detecting circuit 24, the location of the fault is detected in accordance with the signals detected by the optical current sensors and power transformers. In FIG. 12 there are shown only three optical current sensor units, in practice a larger number of optical current sensor units are provided.

Figure 13:
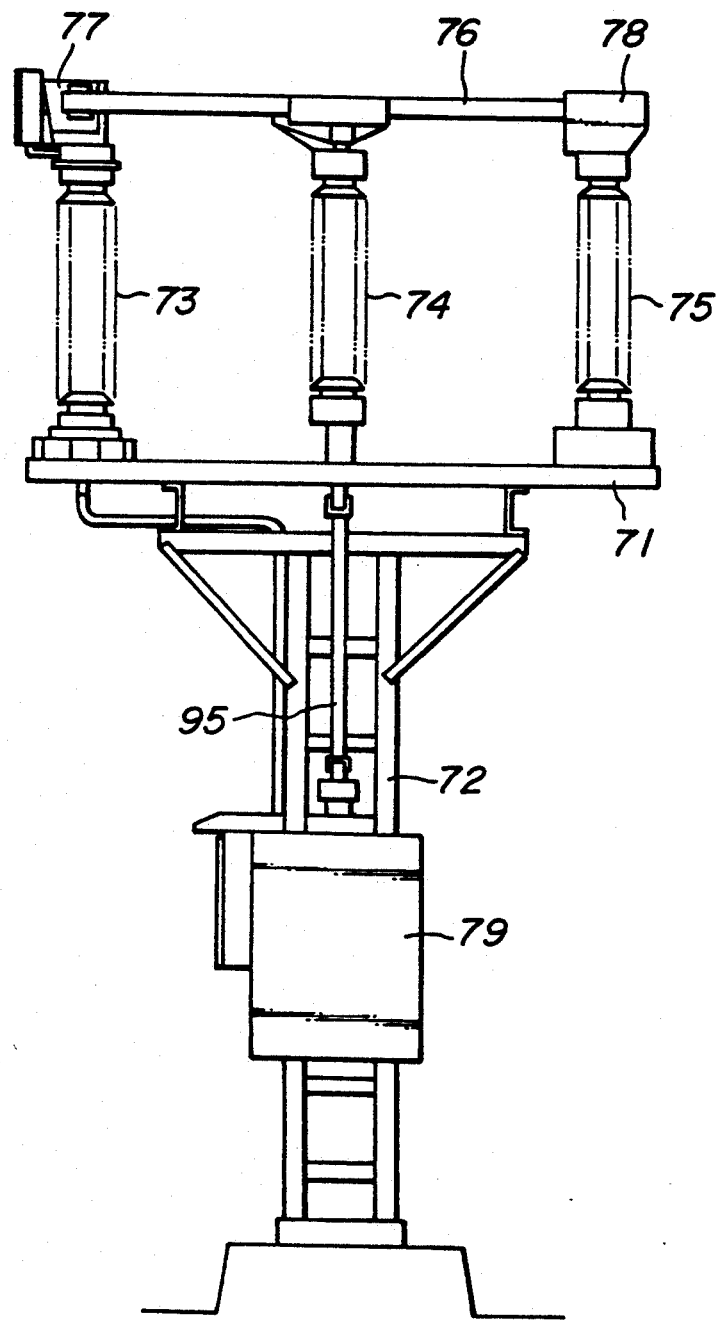
FIG. 13 is a side view showing the disconnecting switch including the optical current sensor.

FIG. 13 is a front view illustrating the construction of the bus disconnecting switch unit. In FIG. 13, a base 71 is arranged on a top of a tower 72, and the insulator posts 73, 74 and 75 are provided on the base 71. The central insulating post 74 is arranged rotatably and a disconnecting blade 76 is secured to the top of the insulator post 74. On the tops of the insulating posts 73 and 75 on both sides of the central insulating post 74 there are secured conductive fitting plates 77 and 78 for connecting the bus bars. Further, on the tower 72 there is arranged an operation box 79.

Figure 14:
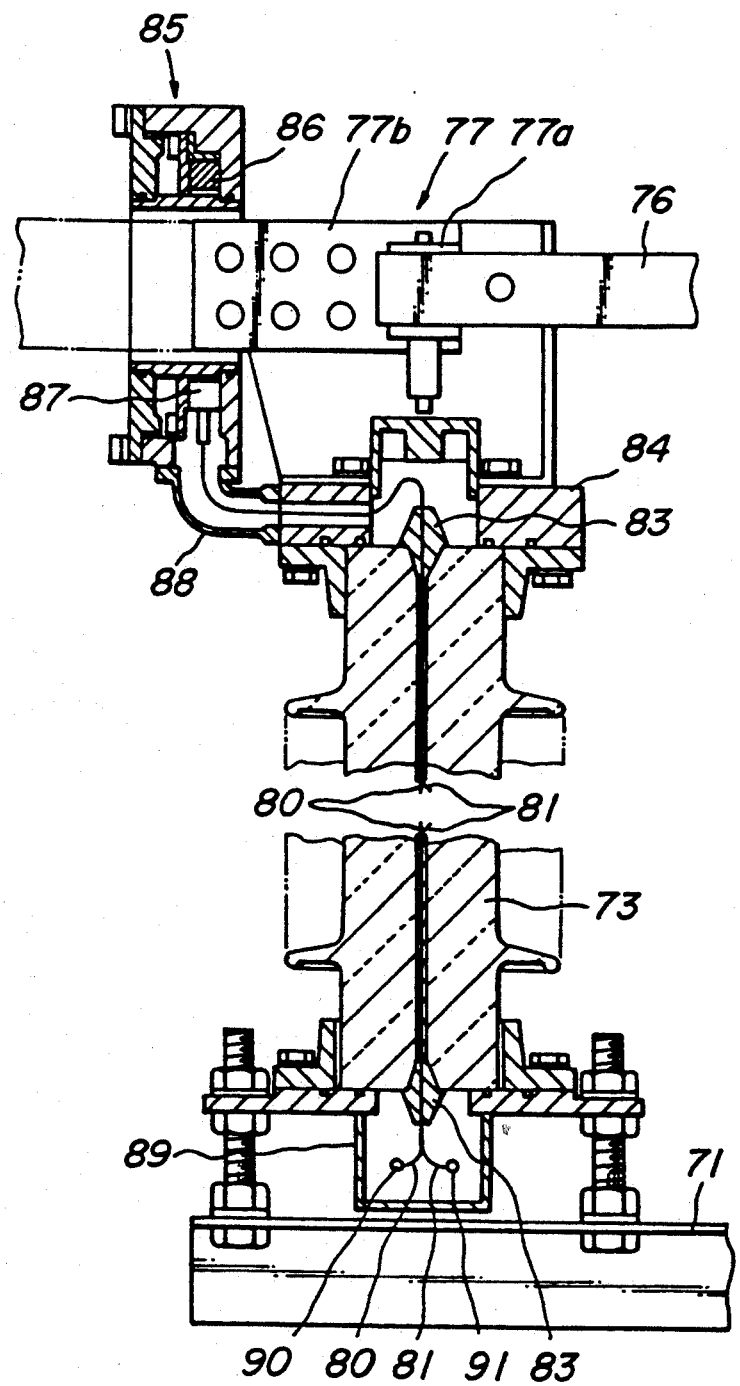
FIG. 14 is a cross sectional view of the insulator post having the optical fibers contained therein.
Figure 15:
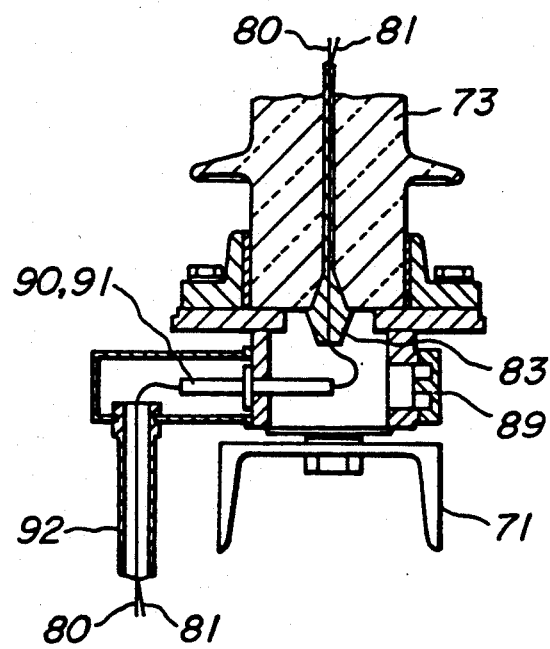
FIG. 15 is a cross sectional view illustrating the lower portion of the insulator post of FIG. 14.

As shown in FIG. 14 the insulator post 73 has formed therein a central hole in which the optical fibers 80 and 81 are inserted. The optical fibers 80 and 81 are fixed in the hole of the insulator post 73 by means of a fitting agent 83 such as silicon resin. The upper and lower openings of the hole are also closed with the fitting agent 83. A reference numeral 84 denotes a lid secured to the top of the insulating post 73 in the air-tight manner, and the fitting plate 77 is secured to the top of the lid. The fitting plate 77 comprises a contact member 77a for receiving the blade 76 and a terminal plate 77b to which is connected the bus bar. The sensor head 85 of the optical current sensor has a ring-shaped configuration and is arranged on the terminal plate 77b such that the sensor head surrounds the terminal plate. According to the invention, the optical current sensor is arranged near the terminal plate 77b to detect the current passing therethrough, and in the present embodiment the optical current sensor is formed to convert the current into the light signal. To this end, the sensor head 85 comprises a substantially ring-shaped magnetic core 86 and a Faraday element 87 such as YIG and BSO. In this case, the current is detected on the basis of the rotation of the polarizing plane of the laser beam due to the magnetic field, and there are arranged two optical fibers 80 and 81, one being used for conducting the light beam emitted from the laser diode to the Faraday element and the other being utilized for conducting the laser light beam transmitted through the Faraday element to the photodiode. To the side wall of the lid there is secured an air-tight tube 88 and the optical fibers extending from the fitting agent 83 are passed through the tube and are optically coupled with the Faraday element 87 provided in the sensor head 85. Since the optical fibers 80 and 81 are arranged in the hermetic tube 88, they are hardly affected by rains and wet air and further the tube can effectively prevent the rains from penetrating into the insulator post 73. To the lower end of the insulator post 73 is also secured an air-tight cup 89, and the optical fibers 80 and 81 are extended to the exterior of the cup by means of air-tight connectors 90 and 91. FIG. 15 is a cross sectional view showing the detailed construction of the lower portion of the insulator post 73. The optical fibers 80 and 81 are further extended from the cup 89 by means of a protection tube 92. In the present embodiment, the interior of the air-tight cup 89 is vacant, but it may be filled with an inorganic substance such as formed resin and liquid silicon In such a case, even if the air-tight function of the cup might be broken partially, the intrusion of moisture and water can be effectively prevented.

By operating an axis 95 (see FIG. 13) extending from the operation box 79 to the central insulator post 74, the conductive blade 76 can be rotated and the bus bar disconnecting switch can be closed or opened. This function is the same as the known disconnecting switch. In the present invention, as long as the disconnecting switch is closed, the Faraday element 87 of the sensor head of the optical current sensor is in the magnetic field caused by the current passing through the terminal plate 77b, and the laser light beam transmitted through the Faraday element 87 is modulated in accordance with an amplitude and direction of the current. The laser light beam thus modulated is transmitted to the photodiode by means of the optical fiber 81, and the amplitude and direction of the current are detected and the location of the fault is judged. The fault location thus detected is displayed on the display unit provided in the operation box 79. Therefore, the operator can know the fault location within the substation precisely and easily from the display on the display unit so that it is effectively prevented that the disconnecting switch might be erroneously opened while the current flows through the relevant disconnecting switch. Further, since the operator can easily know the disconnecting switches through which the currents pass, and thus the power supply can be restored promptly, while the area to which the power supply could not be effected can be limited as small as possible.

In the fault location detecting system according to the present invention, since the information about the current is derived as the light signal and is transmitted to the exterior by means of the optical fibers which are hardly influenced by the external noise such as the surrounding electric field, the fault location can be detected precisely and stably. Further, since the optical fibers are electrically insulating, they can be advantageously utilized in the high tension circuit in the substation. Particularly, in the above mentioned embodiment, the optical fibers are protected by the insulator post, air tight tube, air tight cup and air-tight connector, so that the optical fibers are hardly degraded by the contact with the water and wet air and the system can operate stably for a very long time. This feature is particularly important for the unattended substation. Moreover, in the above embodiment, the optical fibers are arranged within the insulator post and the sensor head is provided on the top of the insulator post, and therefore the system can be easily installed in the existing substation without requiring any extra space. Further, the optical sensor is less expensive than the current transformer. It should be further noted that the ring shaped sensor head is preferably provided around the terminal plate of the bus disconnecting switch without altering the construction of the existing disconnecting switch.

Figure 16:
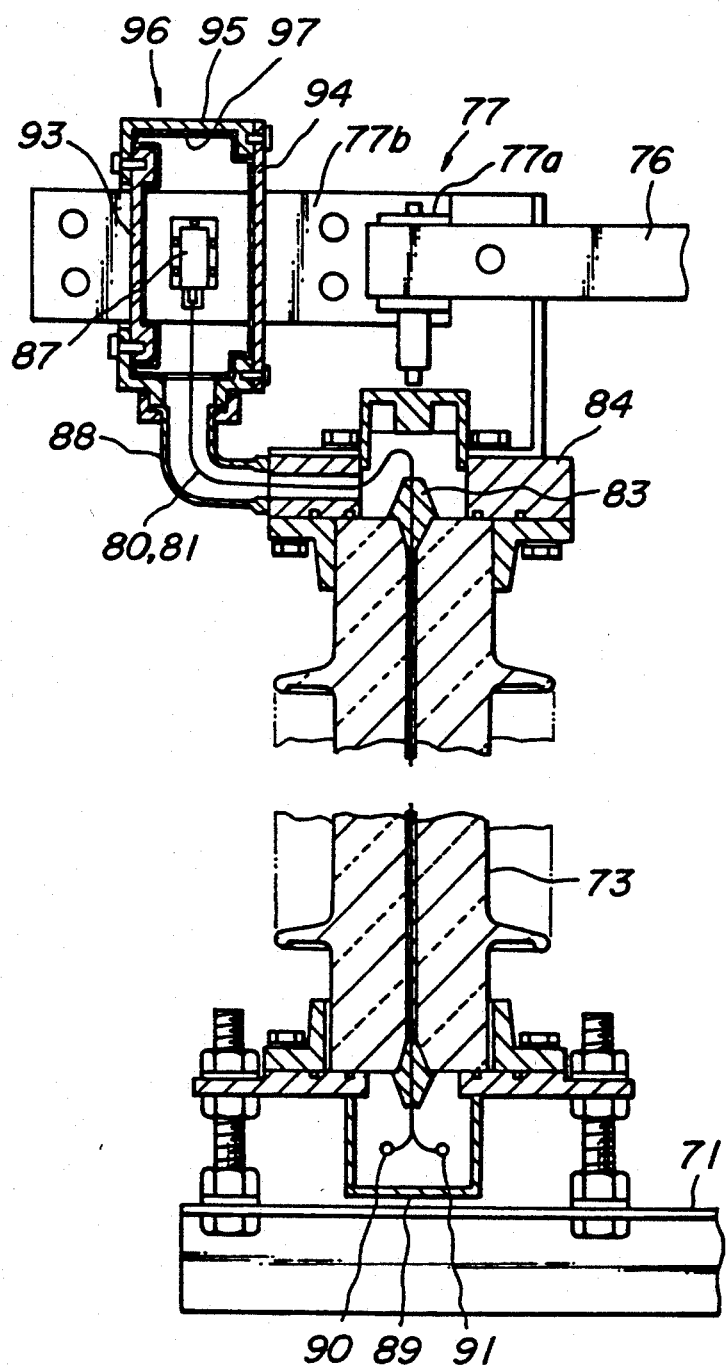
FIG. 16 is a cross sectional view depicting another embodiment of the insulator post comprising the optical current sensor.
Figure 17:
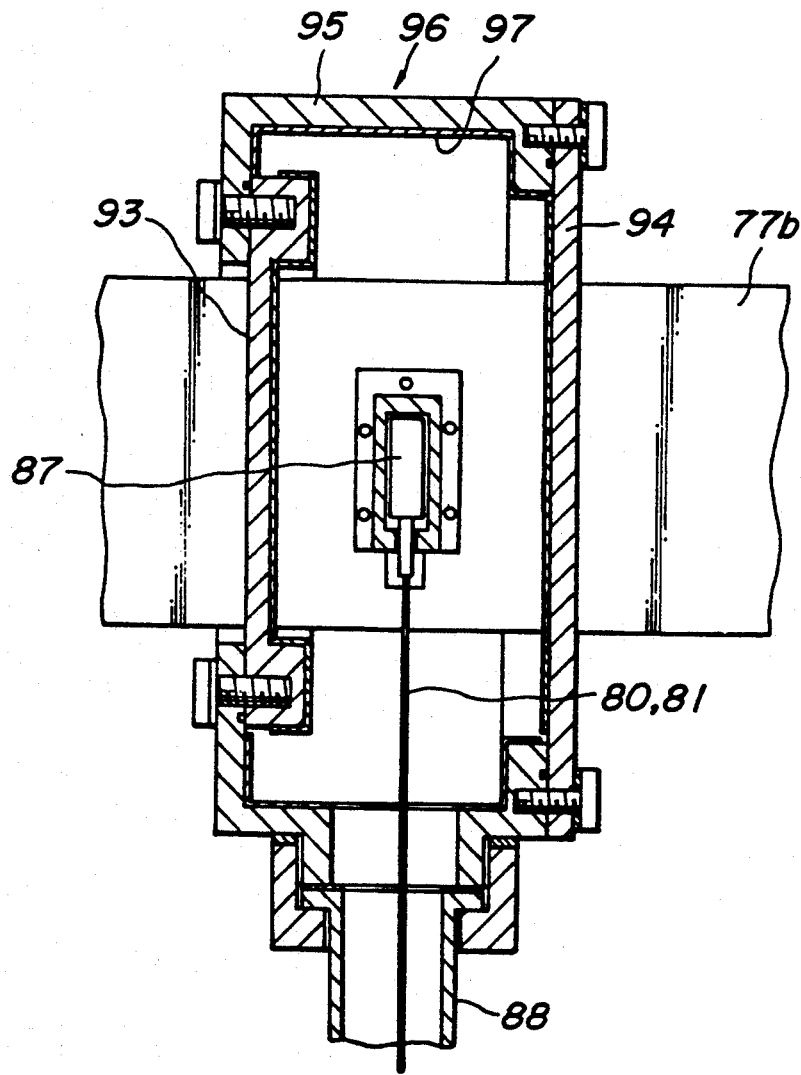
FIG. 17 is a cross sectional view showing a part of the optical current sensor of FIG. 16.
Figure 18:
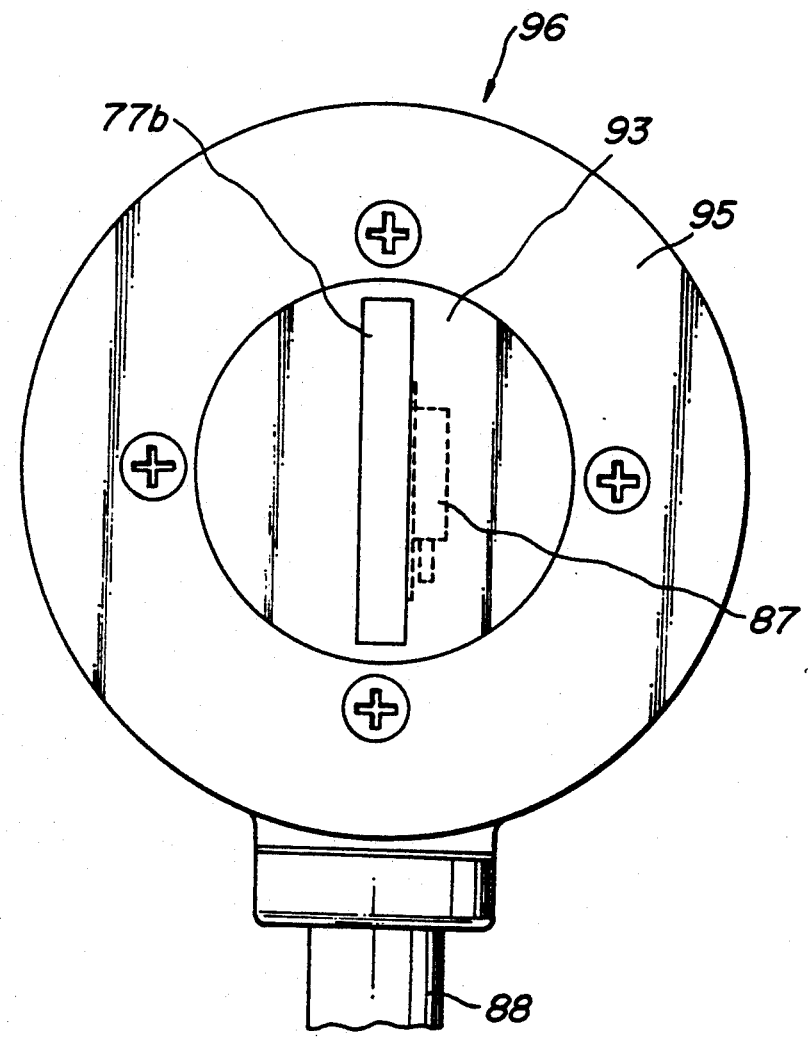
FIG. 18 is a side view of the optical current sensor shown in FIG. 17.

FIGS. 16, 17 and 18 are cross sectional views and a side view showing a modification of the insulator post according to the present invention. In this embodiment, portions similar to those of the embodiment illustrated in FIG. 14 are denoted by the same reference numerals used in FIG. 14. Also in the present embodiment, the optical fibers 80 and 81 are arranged in the central hole formed in the insulator post of the bus bar disconnecting switch. In the previous embodiment, the Faraday element is arranged in the gap formed in the magnetic core arranged around the terminal plate of fitting member provided on the top of the insulator post. In the present embodiment, the Faraday element 87 is directly applied on the terminal plate 77b of the fitting member 77. In order to keep the Faraday element 87 in the air-tight space, two circular plates 93 and 94 are integrally formed with the terminal plate 77b and these circular plates are connected to each other by means of an insulating sleeve 95 so as to form a space surrounding the Faraday element 87. That is to say, the circular plates 93, 94 and sleeve 95 constitute a sensor box 96 in which the Faraday element 87 is arranged. As shown in FIG. 17 on an enlarged scale, on the whole inner wall of the sensor box 96 is applied a magnetic shielding plate 97 so that the Faraday element 87 is protected against the external magnetic field. The magnetic shielding plate 97 may be made of a magnetic material plate, typically an iron plate. The lower end of the sensor box 96 is communicated with the air-tight tube 88 in the air-tight manner and the optical fibers 80 and 81 are coupled with the Faraday element 87 via the air-tight tube 88 and the sensor box 96. The construction of the lower portion of the insulator post 73 is entirely the same as that of the previous embodiment shown in FIG. 14.

Figure 19:
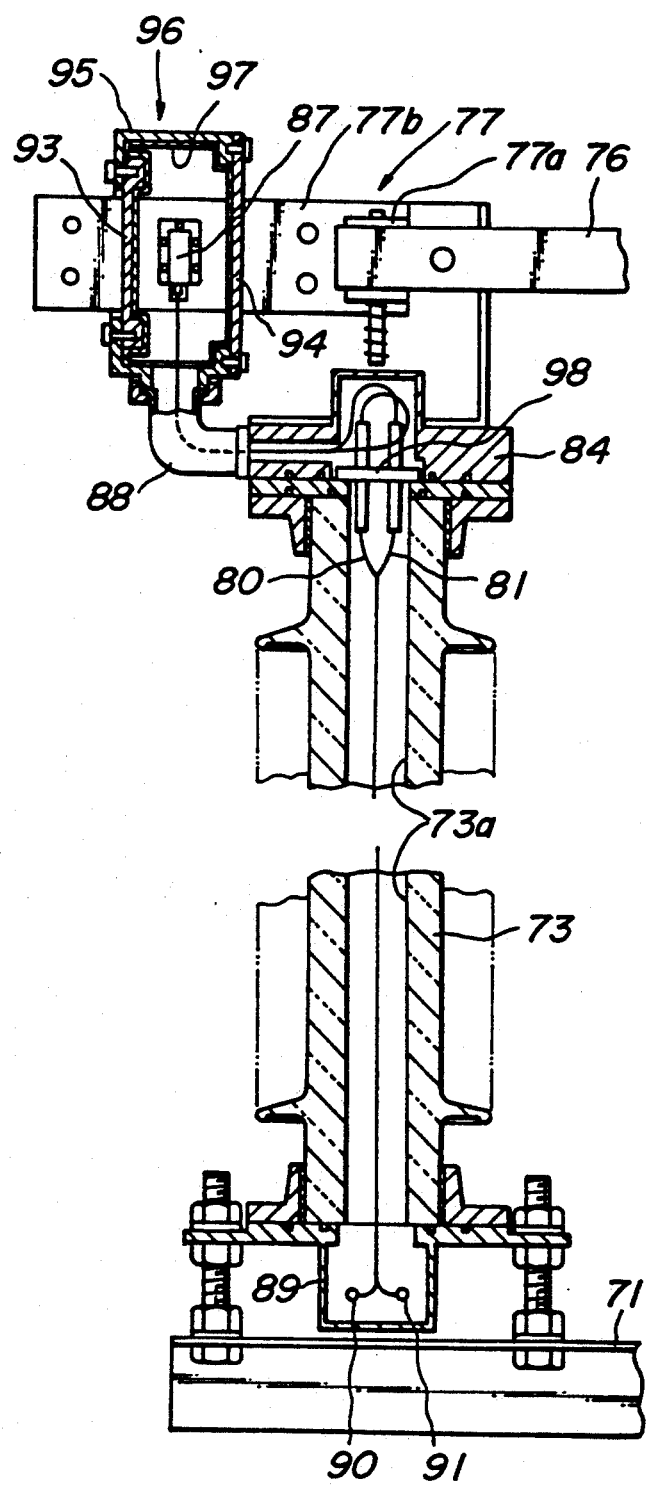
FIG. 19 is a cross sectional view showing still another embodiment of the insulator post including the optical current sensor.

FIG. 19 is a cross sectional view showing a modification of the embodiment illustrated in FIG. 16. In the present embodiment, the optical fibers 80 and 81 are inserted into the central hole 73a formed in the insulator post 73 and the inside space of the hole is filled with an insulating gas such as $SF_6$. The optical fibers 80 and 81 are extended from the insulator post 73 by means of a cover plate 98 in the air-tight manner. The remaining construction is same as that of the embodiment shown in FIG. 16. Within the cup 89 there are arranged a pressure sensor (not shown) for detecting the leakage of the insulating gas filled therein and a drying agent (not shown) for keeping the inside of the cup dry.

Figure 20:
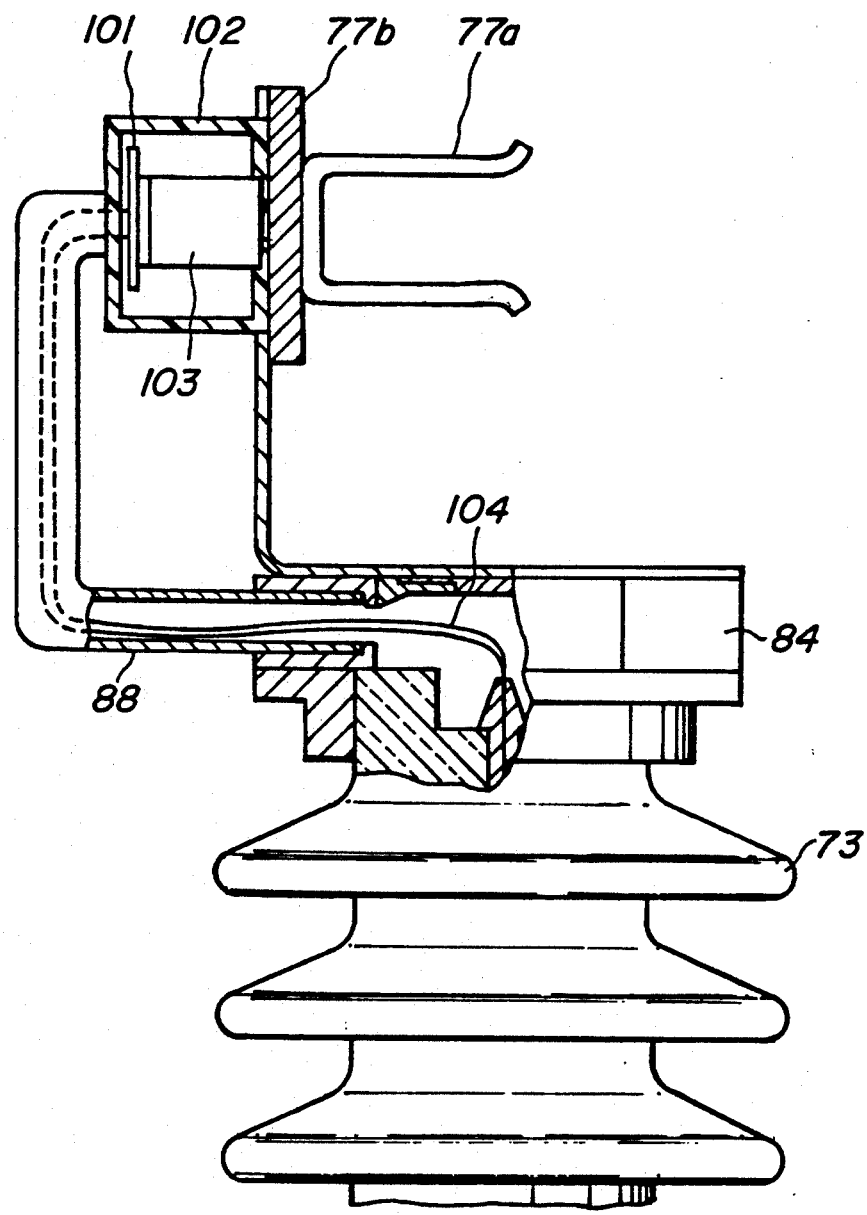
FIG. 20 is a partial cross sectional view representing still another embodiment of the insulator post having the optical current sensor.
Figure 21:
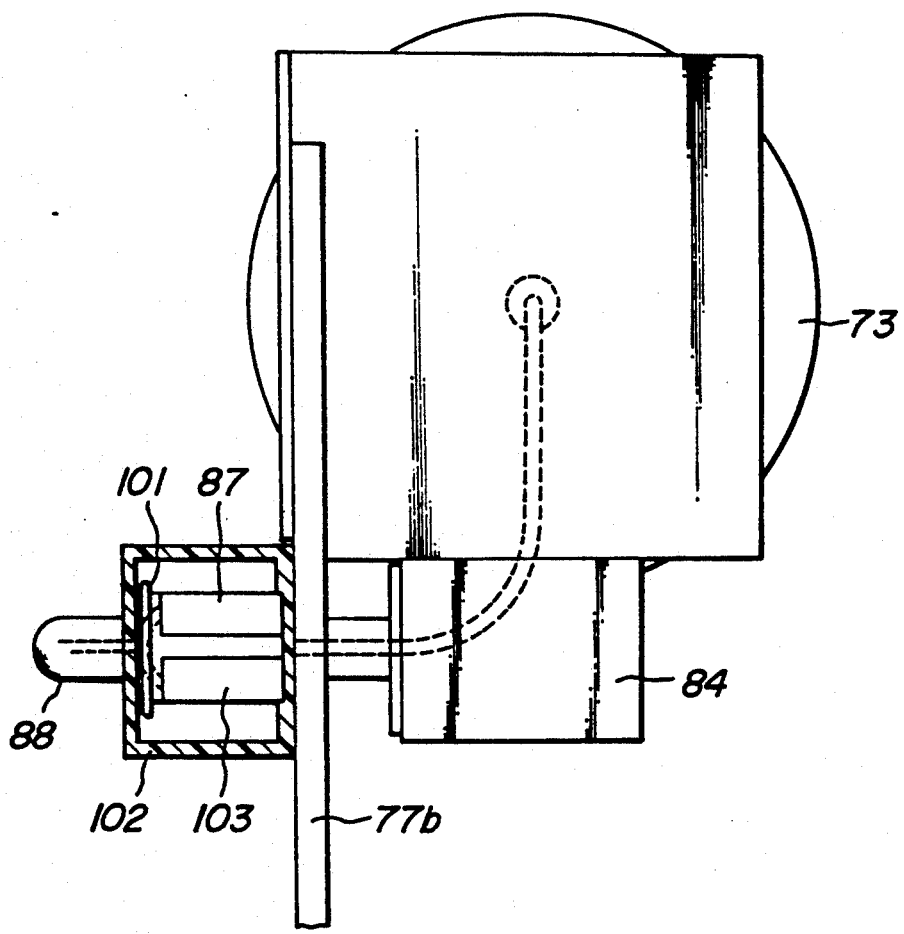
FIG. 21 is a side view of the optical current sensor shown in FIG. 20.

FIGS. 20 and 21 represent the construction of the sensor head of another embodiment of the optical current sensor according to the invention. In the present embodiment, in addition to the optical current sensor there is arranged an optical voltage sensor. To this end, an intermediate electrode 101 is arranged within an insulating cover 102 in which the Faraday element 87 and a Pockel element 103 made of BSO and $LiNb_3O$ are installed, so that the voltage induced across the terminal plate 77b and the intermediate electrode 101 is detected by the Pockel element 103. At the same time, the current passing through the terminal plate 77b is detected by the Faraday element 87. Optical fibers 104 for conducting the light beam to and from the Faraday element 87 and Pockel element 103 are inserted into the central hole formed in the insulator post 73 and a space between the inner wall of the central hole and the optical fibers is filled with an insulating resin such as silicon rubber.

In the embodiment shown in FIG. 14, the magnetic core and the Faraday element are formed as an integrated single body which is arranged on the top of the insulator post of the bus bar disconnecting switch. According to the invention, the magnetic core and the Faraday element may be arranged separately from each other. Such an embodiment will now be explained with reference to FIGS. 22, 23 and 24.

Figure 22:
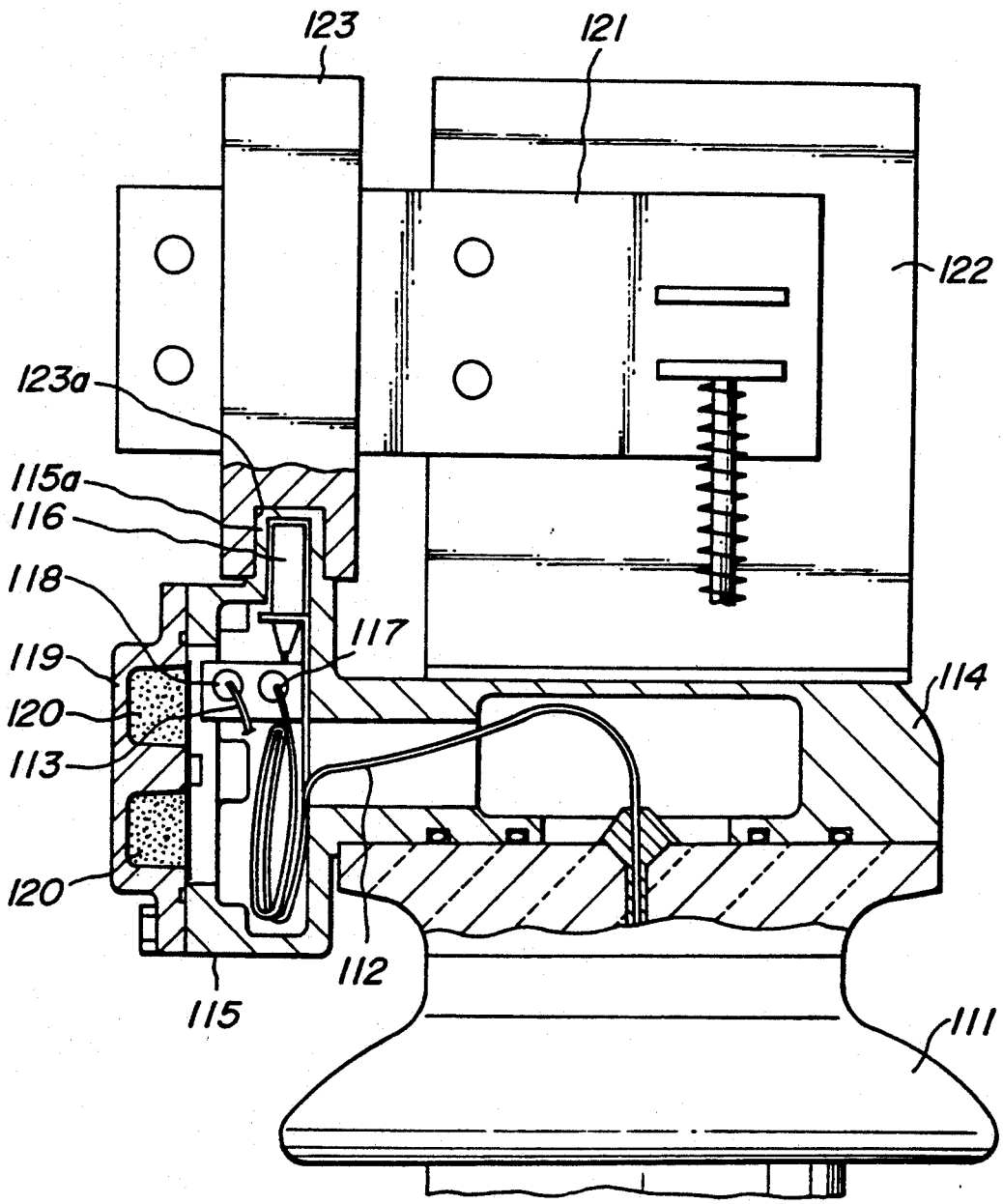
FIG. 22 is a partial cross sectional view illustrating still another embodiment of the insulator post including the optical current sensor.
Figure 23:
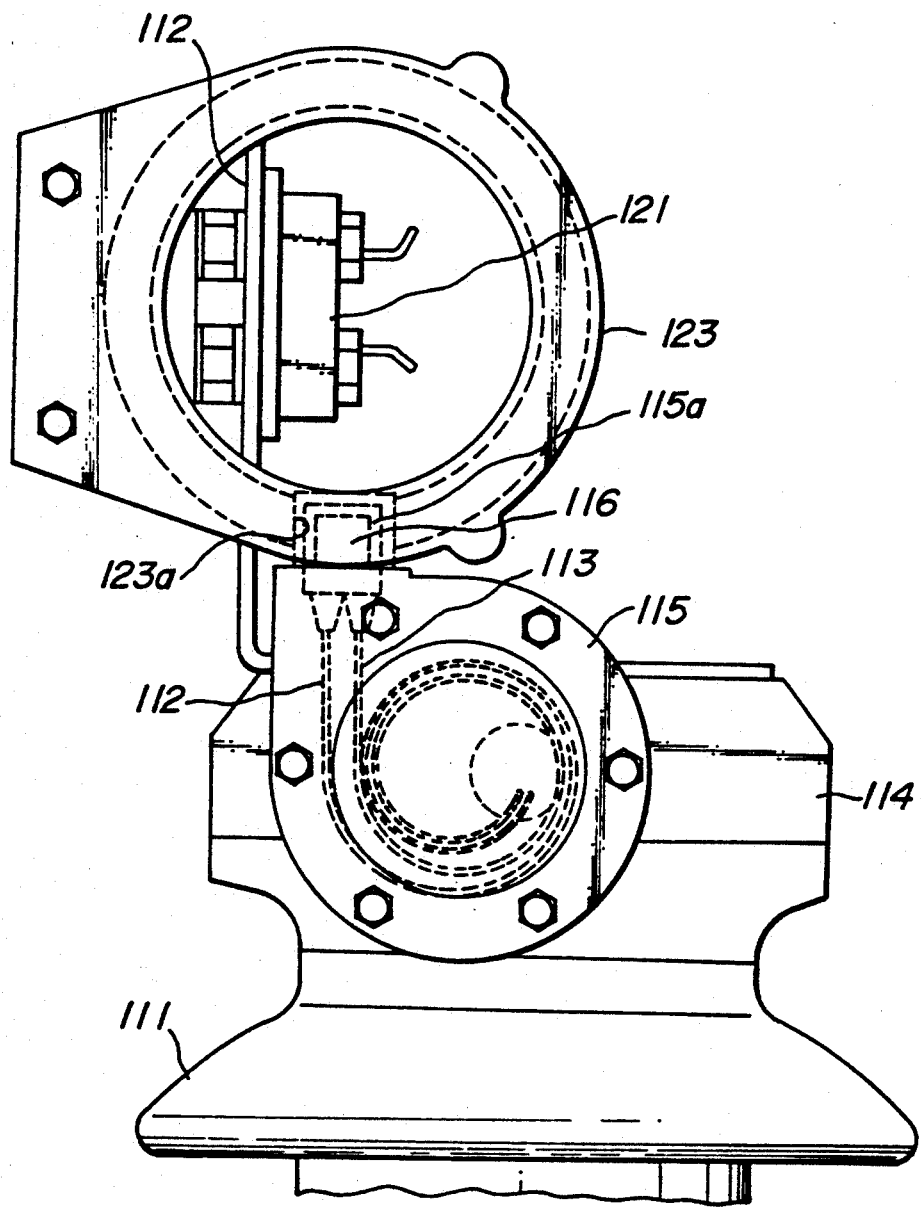
FIG. 23 is a side view of the optical current sensor depicted in FIG. 22.

In FIGS. 22 and 23, a reference numeral 111 denotes an insulating body made of ceramics and optical fibers 112 and 113 are inserted into a central hole formed in the insulator 111. To the top of the insulator 111 there is arranged an optical fiber protecting cover 114 within which the optical fibers 112 and 113 are slightly bent and are guided toward the side of the cover. To the side of the protection cover 114 is secured an optical fiber containing case 115 and the optical fibers are wound by several turns within the case. Integrally with the optical fiber containing case 115 is formed a sensor head case portion 115a in which a Faraday element 116 is installed. The optical fibers 112 and 113 are coupled with the Faraday element 116 by means of connectors 117 and 118, respectively. It should be noted that the optical fiber case 115 may be formed together with the protection cover 114 as a single body. The protection cover 114 is generally made of a metal such as aluminum, but may be made of ceramics. In this case, the increase in the height of the insulator post may be restricted.

Since the Faraday element 116 operates in accordance with the strength of the magnetic field applied thereto, the sensor head case 115a is preferably made of a non-magnetic material such as aluminum. Further in order to keep the reliability of the optical current sensor for a long time, the protection cover 114 and the sensor head case 115a preferably have the air-tight construction. Instead of constructing the optical fiber protection cover 114 and the sensor head case 115a in the air-tight manner, the space within these members may be filled with fitting material such as foamed resin and liquid silicon. Within a lid 119 of the optical fiber containing case 115 there is arranged a drying agent 120 for keeping the inside thereof dry, so that even when the air-tight protection is broken, the optical fibers 112, 113 and the Faraday element 116 are not affected by the water and moisture.

To the top of the insulator 111 there is secured a conductor 121 by means of a fitting member 122. In the present embodiment, the conductor 121 is the terminal plate of the bus bar disconnecting switch, but according to the invention, the conductor is not limited to it. Around the conductor 121 there is arranged a magnetic core 123 for amplifying the magnetic field generated by the current passing through the conductor 121 and for decreasing the influence of noise magnetic field induced by currents which should not be detected. The magnetic core 123 is secured to the fitting member 122 by means of a suitable fitting not shown. In the present embodiment, the magnetic core 123 is arranged detachably from the Faraday element 116 as well as the sensor head case 115a. The magnetic core 123 is formed by molding a silicon steel plate core with insulating material such as epoxy resin and epoxy rubber to improve the durability. In comparison with the embodiment shown in FIG. 14, it is no more necessary to provide the core within the hermetic case, so that the whole core can be made small in size. In a lower portion of the core 123 there is formed a gap 123a and the sensor head case 115a is inserted into the gap, so that the Faraday element in the sensor head is magnetically coupled with the magnetic core 123.

Figure 24:
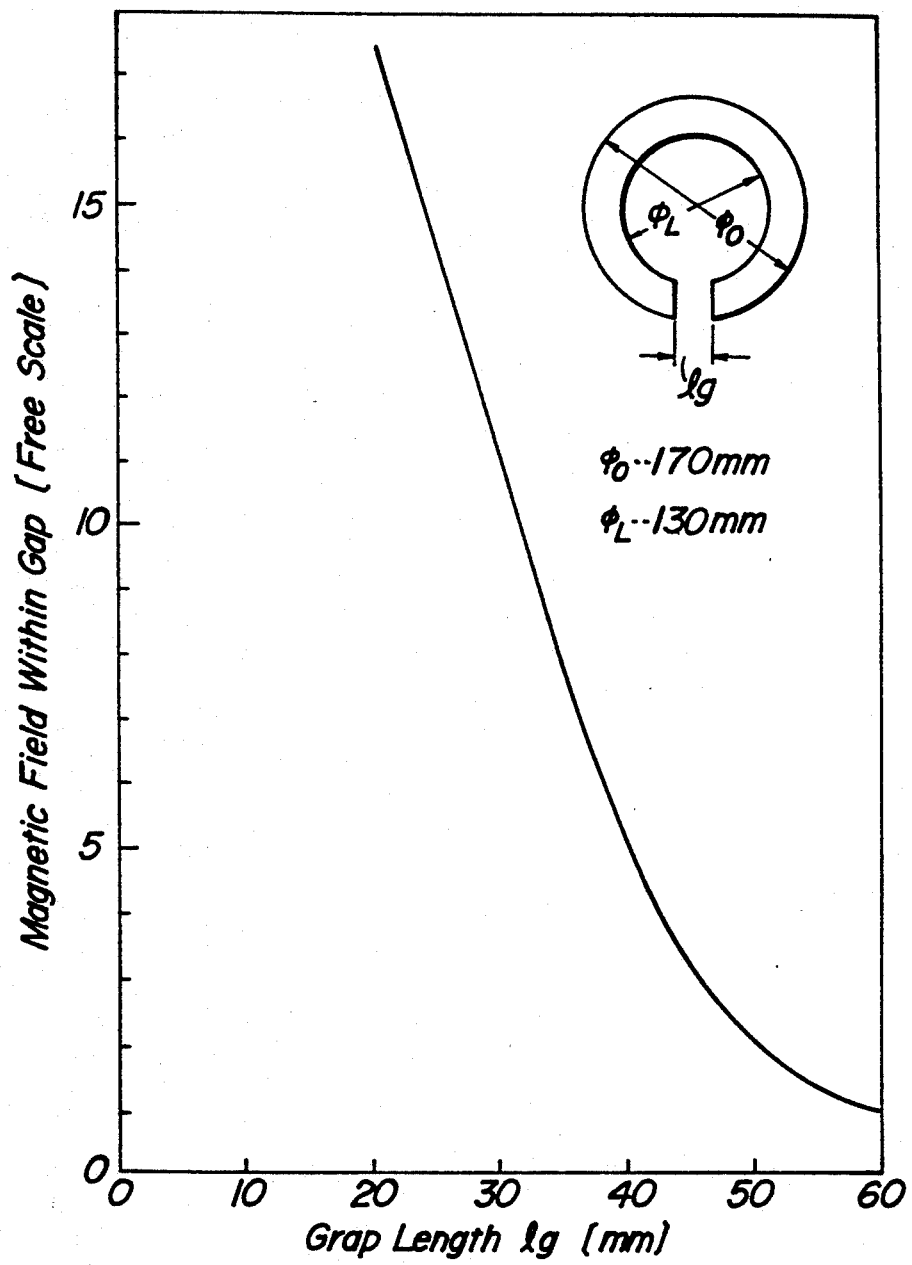
FIG. 24 is a graph representing the relation between the gap length and the magnetic field generated in the gap of the magnetic core in the optical sensor shown in FIG. 22.

It is desired to determine the dimension of the core 123 by considering the magnitude of the current to be detected and the magnetic field-modulation depth characteristic of the optical current sensor. The magnitude of the magnetic field produced in the gap of the core 123 is largely dependent upon the dimension of the core, particularly the length of the gap. An example of the principal characteristic of the gap length and the magnetic field generated therein is shown in FIG. 24. It is preferable to fill the space between the gap 123a of the core 123 and the outer wall of the sensor head case 115a with a molding agent such as a silicon rubber in order to prevent the relative vibration of the core and the sensor head case.

In the embodiment just explained above, since the magnetic core 123 and the optical current sensor element 116 are arranged in the detachable manner, it is sufficient to provide only the sensor element within the hermetic housing and the core need not be arranged in the air-tight housing, so that the core can be processed merely by the molding. Therefore, the core can be made small in size and cheap in cost, and the optical current sensor can be easily applied to the existing disconnecting switch. Further, after the core has been provided on the conductive member 121, the sensor head can be inserted into the gap of the core, the optical current sensor can be easily installed in the existing disconnecting switch. Moreover, by preparing several kinds of the core assemblies suitable for various disconnecting switches having different sizes and configurations, it is possible to use the same sensor head assembly commonly for these disconnecting switches. Further, the Faraday element 116 is provided within the sensor head case 115a in the air-tight manner and the optical fibers 112 and 113 coupled to the element are arranged within the hermetic space of the protection cover 114 and optical fiber containing case 115 without applying the excessive tension to the optical fibers, so that the property of the optical fibers are hardly deteriorated for a very long time.

Particularly, when the optical fiber case is formed as the vertical type as shown in FIG. 22, the distance between the top of insulator 111 and the sensor head case 115 can be made small, and this contributes to the application of the optical current sensor to the existing disconnecting switch.

What is claimed is:

1. A system for detecting a location of a fault within a substation in which at least one input line is connected to a plurality of output lines by means of at least one bus bar and a plurality of bus disconnecting switches are connected in circuit portions connecting the input line and the output lines with each other, the system comprising:

a plurality of optical current sensors each of which includes a sensor head housing arranged on top of an insulating post of a respective one of the bus disconnecting switches, a magneto-optical sensing element arranged in said sensor head housing for detecting a current passing through a circuit portion to generate a current detection signal which represents the current flowing through the circuit portion and at least one light transmitting optical fiber having one end coupled with said magneto-optical sensing element and inserted into a central hole of the insulator post for transmitting the current detection signal; and fault location detecting means connected to said optical current sensors for receiving and processing the current detection signal of each of said optical current sensors to derive a signal enabling detection of a location of a fault within the substation.

2. The system of claim 1, wherein said fault detecting means comprises a fault location judging means for judging the location of a fault in an automatic manner from the current detection signal of each of said optical current sensors.

3. The system of claim 2, wherein said substation includes at least one current transformer connected to the input line and at least one relay selected from the group consisting of a ground fault detecting relay and a short-circuit fault detecting relay connected to said current transformer, wherein said fault location judging means judge the location of a fault in accordance with the current detection signal of each of said optical current sensors and output signals supplied from said at least one relay.

4. The system of claim 3, wherein said substation comprises a single bus for connecting the at least one input line to the output lines, said optical current sensors and said bus disconnecting switches being arranged between respective junction points between each input line and the bus and respective junction points between each of the output lines and the bus.

5. The system of claim 4, wherein said fault location judging means further comprise a plurality of level detectors each connected to a respective one of said optical current sensors, said level detectors and said at least one relay being constructed such that current detection signals from the level detectors and output signals from said at least one relay are bivalent signals, and said fault location judging means are constructed to judge the fault location by processing the bivalent signals in a matrix method.

6. The system of claim 4, wherein said fault location judging means are constructed such that the fault location is judged also from the directions of the currents detected by said at least one relay.

7. The system of claim 3, wherein the at least one input line is connected to two bus bars via the bus disconnecting switches and the output lines are connected to the two bus bars via the bus disconnecting switches, wherein said optical current sensors are arranged to detect currents passing through respective ones of the bus disconnecting switches.

8. The system of claim 7, wherein said fault location judging means are constructed such that the fault location is judged also from the directions of the currents detected by said at least one relay.

9. The system of claim 1, wherein each of said optical current sensor comprises a light emitting and receiving member coupled with the other end of the optical fiber, a protection tube arranged on the top of the insulator post through which the optical fiber is passed to the sensor head housing, and a protection cup through which the optical fiber is passed to the light emitting and receiving member by means of an air-tight connector.

10. The system of claim 9, further comprising an electrically conductive member through which the current to be detected is passed, said conductive member being secured to the magneto-optical element.

11. The system of claim 9, wherein a space between the optical fiber and an inner wall of the central hole in which the optical fiber is inserted is filled with an insulating organic material.

12. The system of claim 10, further comprising a magnetic shielding plate applied on an inner wall of the sensor head housing.

13. The system of claim 1, wherein each of said optical current sensors comprises a magnetic core for applying a magnetic field to said magneto-optical element, said magnetic field corresponding to the current to be detected by said optical current sensors.

14. The system of claim 13, wherein said magnetic core has a gap formed therein, and said sensor head housing is detachably inserted into the gap of said magnetic core.

* * * * *